United States Patent
Yoshida

(10) Patent No.: US 10,142,573 B2
(45) Date of Patent: *Nov. 27, 2018

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Daisuke Yoshida, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/724,949

(22) Filed: Oct. 4, 2017

(65) Prior Publication Data

US 2018/0041726 A1 Feb. 8, 2018

Related U.S. Application Data

(63) Continuation of application No. 15/082,937, filed on Mar. 28, 2016, now Pat. No. 9,813,649.

(30) Foreign Application Priority Data

Mar. 30, 2015 (JP) ................. 2015-070196

(51) Int. Cl.
*H04N 5/374* (2011.01)
*H04N 5/359* (2011.01)
(Continued)

(52) U.S. Cl.
CPC ....... *H04N 5/374* (2013.01); *H01L 27/14614* (2013.01); *H01L 27/14643* (2013.01);
(Continued)

(58) Field of Classification Search
CPC ........ H04N 5/374; H04N 5/359; H04N 5/378; H04N 5/37457; H01L 27/14614; H01L 27/14643

See application file for complete search history.

(56) References Cited

U.S. PATENT DOCUMENTS

2001/0020909 A1  9/2001 Sakuragi et al.
2003/0193595 A1  10/2003 Henderson
(Continued)

FOREIGN PATENT DOCUMENTS

EP  1351490 A1  10/2003
EP  1635470 A1  3/2006
(Continued)

*Primary Examiner* — Padma Haliyur
(74) *Attorney, Agent, or Firm* — Canon U.S.A., Inc. IP Division

(57) ABSTRACT

In a photoelectric conversion apparatus, a pixel transistor and a differential transistor form a differential pair. A clamp circuit clamps a gate voltage of the differential transistor. An output circuit performs a first operation in which a voltage based on the voltage at the gate of a pixel transistor is output to the gate of the differential transistor. The output circuit also performs a second operation in which in response to receiving a current from the differential transistor, a signal based on a result of a comparison between the gate voltage of the pixel transistor and the gate voltage of the differential transistor is output to the output node. In the second operation, a control unit in the output circuit controls a change in the drain voltage of the differential transistor to be smaller than a change in the voltage at the output node.

69 Claims, 14 Drawing Sheets

(51) Int. Cl.
*H04N 5/3745* (2011.01)
*H04N 5/378* (2011.01)
*H01L 27/146* (2006.01)

(52) U.S. Cl.
CPC ............ *H04N 5/359* (2013.01); *H04N 5/378* (2013.01); *H04N 5/37457* (2013.01); *H05K 999/99* (2013.01)

(56) References Cited

U.S. PATENT DOCUMENTS

| | | |
|---|---|---|
| 2006/0220941 A1 | 10/2006 | Lee |
| 2008/0111905 A1 | 5/2008 | Toyama |
| 2013/0009800 A1 | 1/2013 | Yang |
| 2013/0215303 A1 | 8/2013 | Ueno |
| 2014/0291482 A1 | 10/2014 | Tanaka |

FOREIGN PATENT DOCUMENTS

| | | |
|---|---|---|
| JP | 2005311487 A | 11/2005 |
| JP | 2014-197773 A | 10/2014 |
| TW | 200742426 A1 | 11/2007 |
| TW | 201144973 A | 12/2011 |

PHOTOELECTRIC CONVERSION APPARATUS AND PHOTOELECTRIC CONVERSION SYSTEM

CROSS-REFERENCE TO RELATED APPLICATION

This application is a Continuation of U.S. application Ser. No. 15/082,937, filed Mar. 28, 2016, which claims priority from Japanese Patent Application No. 2015-070196, filed Mar. 30, 2015, which are hereby incorporated by reference herein in their entireties.

BACKGROUND OF THE INVENTION

Field of the Invention

The present disclosure relates to a photoelectric conversion apparatus and a photoelectric conversion system.

Description of the Related Art

In a photoelectric conversion apparatus disclosed in FIG. 2 in Japanese Patent Laid-Open No. 2005-311487 (hereinafter, referred to as PTL 1), a differential amplifier is formed using a pixel amplification transistor (114 in FIG. 2) of a pixel and a differential transistor (201 in FIG. 2) disposed in each column. To the pixel amplification transistor, a signal based on an electric charge generated in a photoelectric conversion element is input. To the differential transistor, a reference voltage with a ramp waveform is input. Via an operation in which a voltage at a gate of the pixel amplification transistor is compared with a voltage at a gate of the differential transistor, the signal based on the electric charge generated in the photoelectric conversion element is converted to a digital signal.

SUMMARY OF THE INVENTION

In an aspect, the present disclosure provides a photoelectric conversion apparatus including a photoelectric conversion element, a differential pair including a first transistor configured to receive a signal based on an electric charge generated in the photoelectric conversion element and a second transistor configured to receive a reference signal, a clamp circuit configured to clamp a voltage at a gate of the second transistor, and an output circuit configured to perform a first operation to output a voltage based on a voltage at a gate of the first transistor to the gate of the second transistor and a second operation to receive a current from the second transistor, and to output a signal based on a result of a comparison between the voltage at the gate of the first transistor and a voltage at the gate of the second transistor to an output node. The output circuit includes a control unit configured to control, in the second operation, an amount of change in a voltage at a drain of the second transistor so as to be smaller than an amount of change in a voltage at the output node.

In another aspect, the present disclosure provides a photoelectric conversion apparatus including a photoelectric conversion element, a differential pair including a first transistor configured to receive a signal based on an electric charge generated in the photoelectric conversion element and a second transistor configured to receive a reference signal, a clamp circuit configured to clamp a voltage at a gate of the second transistor, a current mirror circuit including a third transistor electrically connected to the second transistor and a fourth transistor having a gate connected to a gate of the third transistor, and a first switch element connecting the gate and a drain of the fourth transistor.

Further features of the present invention will become apparent from the following description of exemplary embodiments with reference to the attached drawings.

DESCRIPTION OF THE EMBODIMENTS

Some embodiments may improve the accuracy of the signal output from the photoelectric conversion apparatus.

In the photoelectric conversion apparatus, there is a possibility where deterioration in accuracy of a signal output from the photoelectric conversion apparatus may occur. In the photoelectric conversion apparatus disclosed in FIG. 2 in PTL 1, a drain of the differential transistor functions as an output node of the differential amplifier. Therefore, in the comparison operation, when an inversion occurs in a voltage relationship between the voltage at the gate of the pixel amplification transistor and the voltage at the gate of the differential transistor, i. e. the voltage relationship is inverted, the voltage at the drain of the differential transistor may change significantly. More specifically, the amount of the change in the voltage at the drain of the differential transistor is close to, or nearly equal to the difference between a ground voltage and a power supply voltage (AVD in FIG. 2). The change in the voltage at the drain of the differential transistor may be transmitted to the gate of the differential transistor which is connected to a node supplying the reference signal, via parasitic capacitance between the gate and the drain of the differential transistor.

The change in the voltage at the node supplying the reference signal may cause deterioration in the accuracy of the signal output from the photoelectric conversion apparatus. For example, if the reference signal changes in an opposite direction after the inversion of the output of the differential amplifier, this may result in that the output of this differential amplifier is again inverted. Furthermore, in a case where a common reference signal is supplied to a plurality of differential amplifiers, a change in the reference signal caused by an inversion of the output of a certain differential amplifier may cause the output of another differential amplifier to be inverted. This may deteriorate analog-to-digital conversion accuracy. That is, there is a possibility that a reduction, or deterioration, occurs in accuracy of a digital signal output from the photoelectric conversion apparatus.

Figure 1:
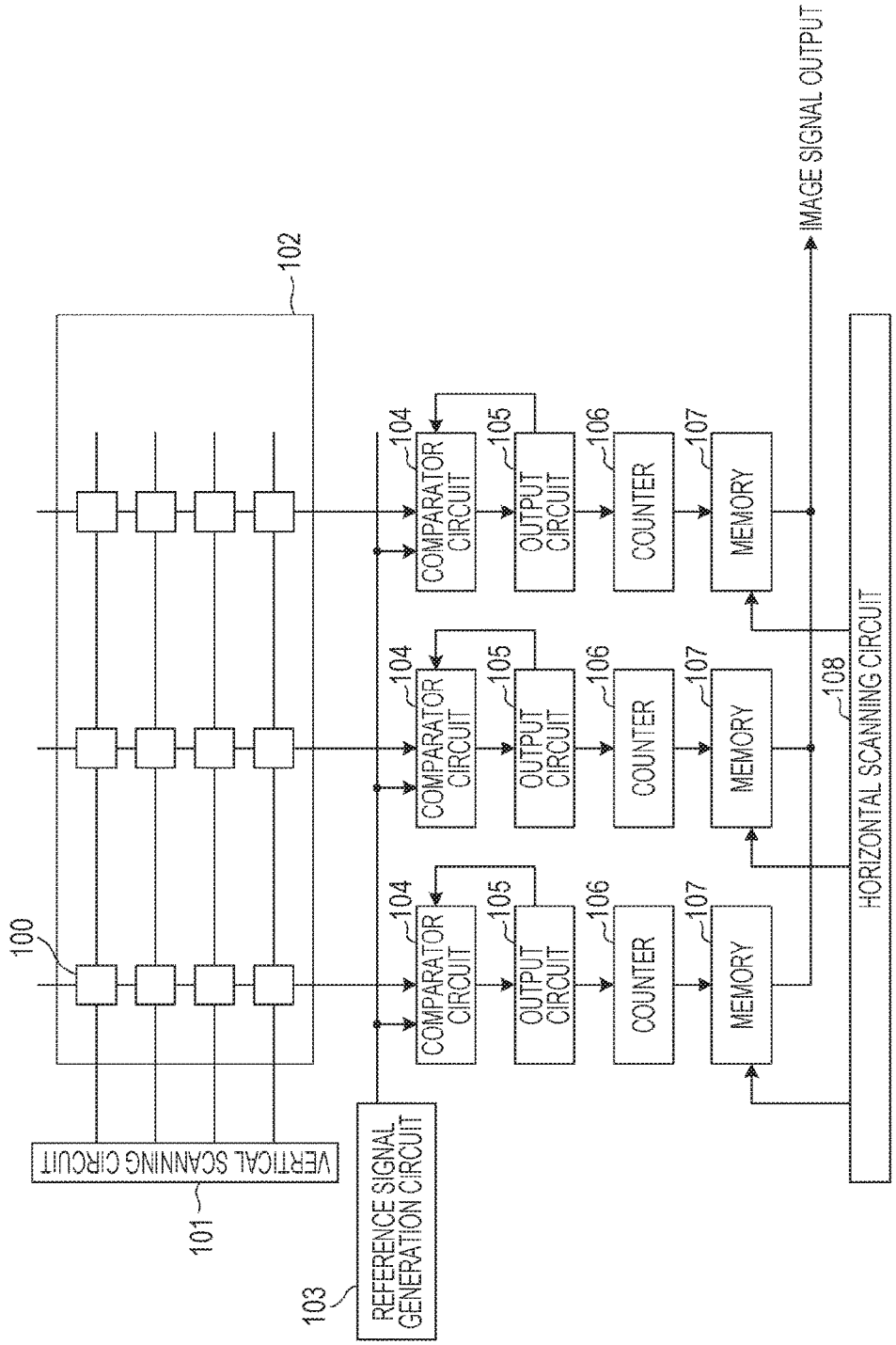
FIG. 1 is a block diagram illustrating an overall configuration of a photoelectric conversion apparatus.

Referring to drawings, aspects of the present disclosure are described below. The aspects explained hereinafter are related to First through Tenth Embodiments in common. FIG. 1 is a block diagram schematically illustrating an overall configuration of a photoelectric conversion apparatus according to an aspect. A plurality of pixels 100 form a pixel array 102. The pixel array 102 includes a plurality of pixel rows and a plurality of pixel columns. A vertical scanning circuit 101 controls the plurality of pixels 100 to read out signals from the plurality of pixels 100. The signals from the plurality of pixels 100 are read out, for example, on a row-by-row basis.

A comparator circuit 104 compares a signal of a pixel 100 with a reference signal. The reference signal generated by a reference signal generation circuit 103 is input to the comparator circuit 104. A control signal based on a result of the comparison made by the comparator circuit 104 is output to a counter 106 via an output circuit 105. This control signal based on the result of the comparison controls a count period of a counter 106. The counter 106 outputs, to a memory 107, a count value corresponding to, or indicating, the timing of receiving the control signal. The count value output to the memory 107 is stored therein as a digital signal indicating a result of an analog-to-digital conversion (hereinafter referred to as an AD conversion) performed on the signal from the pixel 100. The digital signal stored in the memory 107 is sequentially output from the photoelectric conversion apparatus via a horizontal scanning circuit 108.

Furthermore, the output circuit 105 outputs a signal as a feedback signal based on the signal of the pixel 100 to the comparator circuit 104. The comparator circuit 104 is capable of holding the feedback signal.

Figure 2:
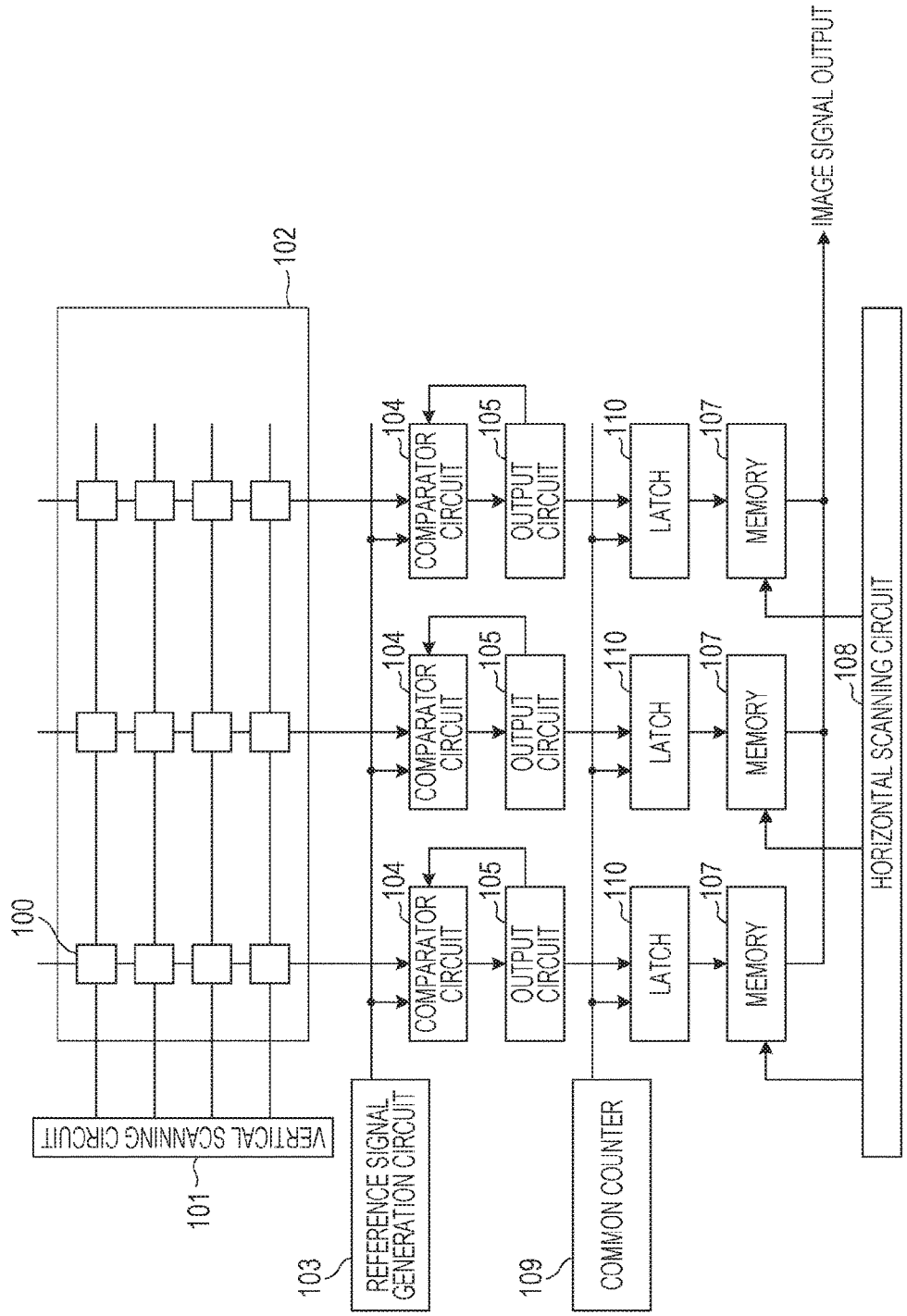
FIG. 2 is a block diagram illustrating an overall configuration of a photoelectric conversion apparatus.

FIG. 2 is a block diagram illustrating an overall configuration of a photoelectric conversion apparatus according to another aspect. In the case of the photoelectric conversion apparatus illustrated in FIG. 1, one counter 106 is disposed in each pixel column. The photoelectric conversion apparatus illustrated in FIG. 2 is different from the photoelectric conversion apparatus illustrated in FIG. 1 in that a common counter 109 is shared by a plurality of pixel columns. More specifically, a count value output by the common counter 109 is input to a latch 110 in each pixel column. Depending on the timing of outputting a control signal from the output circuit 105, the latch 110 of each pixel column latches the count value output from the common counter. The other operations are similar to those of the photoelectric conversion apparatus illustrated in FIG. 1.

Figure 3:
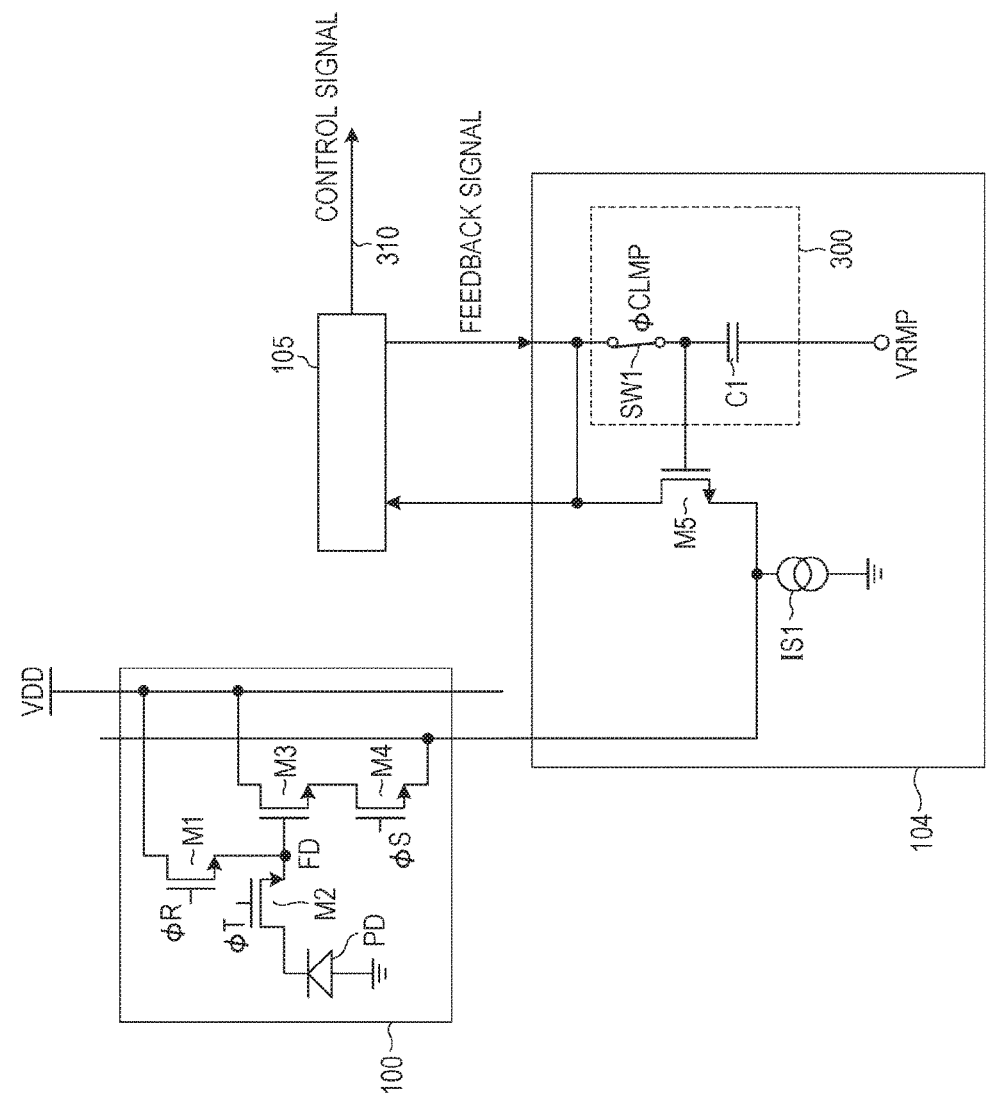
FIG. 3 is a diagram illustrating a configuration of a photoelectric conversion apparatus.

FIG. 3 illustrates configurations of the pixel 100, the comparator circuit 104, and the output circuit 105 of the photoelectric conversion apparatus. For simplicity of illustration, only one pixel 100 is shown in FIG. 3.

The pixel 100 includes a photoelectric conversion element PD, a reset transistor M1, a transfer transistor M2, a pixel transistor M3, and a selection transistor M4. A drive signal φR is input to a gate of the reset transistor M1, a drive signal φT is input to a gate of the transfer transistor M2, and a drive signal φS is input to a gate of the selection transistor M4.

A gate of the pixel transistor M3 is connected to a floating diffusion node (hereinafter referred to as an FD). The electric charge generated in the photoelectric conversion element PD is transferred by the transfer transistor M2 to the FD node. That is, a signal based on the electric charge generated in the photoelectric conversion element PD is input to the gate of the pixel transistor M3. In other words, the pixel transistor M3 receives the signal based on the electric charge generated in the photoelectric conversion element PD at its gate. The reset transistor M1 resets the voltage at the gate of the pixel transistor M3. Note that because the gate of the pixel transistor M3 is connected to the FD node, the gate of the pixel transistor M3 is also referred to as an FD node in the present description.

The comparator circuit 104 includes a differential transistor M5. A reference signal VRMP is input to a gate of the differential transistor M5. In other words, the differential transistor M5 receives the reference signal at its gate. The reference signal VRMP is, for example, a ramp voltage signal whose voltage varies with time. The pixel transistor M3 and the differential transistor M5 may be connected to a tail current source IS1 so as to form a differential pair. In FIG. 3, the tail current source IS1 may be realized with, for example, an NMOS transistor whose gate is applied with a particular bias voltage. The tail current source IS1 may be omitted in some embodiments. The pixel transistor M3 and the differential transistor M5 are the same in terms of conductivity type. In present aspect, the pixel transistor M3 and the differential transistor M5 are both N-channel type MOS transistors.

The comparator circuit 104 includes a clamp circuit 300 that clamps the voltage at the gate of the differential transistor M5 to a particular voltage. The clamp circuit 300 includes, for example, a clamp switch element SW1 and a clamp capacitor element C1. The clamp switch element SW1 is connected to the gate of the differential transistor M5. The clamp switch element SW1 is controlled by a drive signal φCLMP. When the clamp switch element SW1 is turned off, the gate of the differential transistor M5 goes into an electrically floating state. This makes it possible to clamp the voltage at the gate of the differential transistor M5 to a particular voltage. One electrode of the clamp capacitor element C1 is connected to the gate of the differential transistor M5. To the other electrode of the clamp capacitor element C1, the reference signal VRMP is input. In this configuration, an AC component of the reference signal VRMP is input to the gate of the differential transistor M5 via the clamp capacitor element C1.

One comparator circuit 104 shown in FIG. 3 is disposed for a plurality of pixels 100 included in one pixel column although they are not shown in FIG. 3. More specifically, sources of selection transistors M4 of the plurality of pixels 100 are connected together to the tail current source IS1. Furthermore, drains of pixel transistors of the plurality of pixels 100 are connected together. One differential transistor M5 forms a differential pair together with each pixel transistor M3 of a plurality of pixels 100 included in one pixel column. In other words, each pixel transistor M3 included in each of the plurality of pixels 100 and the differential transistor M5 form a differential pair. The photoelectric conversion apparatus for use in capturing an image, that is, the image pickup apparatus includes a plurality of sets of a pixel column and a comparator circuit 104.

The output circuit 105 having an output node 310 is electrically connected to the differential transistor M5. The output node 310 is a node different from any of the source and the drain of the pixel transistor M3 and the source and the drain of the differential transistor M5.

The output circuit 105 performs a first operation in which a voltage based on the voltage at the gate of the pixel transistor M3 is output to the gate of the differential transistor M5. The output circuit 105 also performs a second operation in which the output circuit 105 receives a current from the differential transistor M5, and outputs a signal based on a result of a comparison between the voltage at the gate of the pixel transistor M3 and the voltage at the gate of the differential transistor M5 to the output node 310. In another aspect, the output circuit 105 in the second operation outputs a signal based on a result of a comparison between the voltage at the gate of the pixel transistor M3 and the voltage at the gate of the differential transistor M5 to the output node 310 while receiving a current from the differential transistor M5. In further different aspect, the output circuit 105 in the second operation outputs a signal based on a result of a comparison between the voltage at the gate of the pixel transistor M3 and the voltage at the gate of the differential transistor M5 to the output node 310 in response to receiving a current from the differential transistor M5. In FIG. 3, "feedback signal" denotes the voltage based on the voltage at the gate of the pixel transistor M3, and "control signal" denotes the signal based on the result of the comparison.

In the first operation, the output circuit 105 may operate as a current source that supplies a current to the differential transistor M5. In this case, the output circuit 105 functions as a load of an operational amplifier formed with the pixel transistor M3 and the differential transistor M5. Thus, when the gate and the drain of the differential transistor M5 are short circuited together, the output circuit 105 outputs the voltage based on the voltage at the gate of the pixel transistor M3 to the gate of the differential transistor M5.

By turning off the clamp switch element SW1, the clamp circuit 300 holds the voltage output to the gate of the differential transistor M5. That is, the clamp circuit 300 clamps the voltage at the gate of the differential transistor M5 to the voltage based on the voltage at the gate of the pixel transistor M3. The voltage based on the voltage at the gate of the pixel transistor M3 includes, for example, a voltage substantially equal to the voltage at the gate of the pixel transistor M3. Because there are a difference in transistor characteristic, a difference in temperature, thermal noise, and the like, the two voltages described above may not be exactly equal.

In the second operation, the output circuit 105 may operate as a current detection circuit that detects a current of the differential transistor M5. The current detection circuit outputs a change in current of the differential transistor M5 as another signal to the output node 310 different from the drain of the differential transistor M5. Using this function, the output circuit 105 outputs a signal based on a result of a comparison between the voltage at the gate of the pixel transistor M3 and the voltage at the gate of the differential transistor M5 to the output node 310.

For example, in a case where the voltage at the gate of the differential transistor M5 is higher than the voltage at the gate of the pixel transistor M3, the output circuit 105 outputs a first voltage to the output node 310. On the other hand, in a case where the voltage at the gate of the differential transistor M5 is lower than the voltage at the gate of the pixel transistor M3, the output circuit 105 outputs a second voltage different from the first voltage to the output node 310.

In the description given above, parasitic resistance of a wiring connected to the tail current source IS1 is neglected. The parasitic resistance of the wiring may cause an offset in an operational amplifier formed with the pixel transistor M3 and the differential transistor M5.

The output circuit 105 includes a control unit that controls, in the second operation described above, the change in the voltage at the drain of the differential transistor M5 to be smaller than the change in the voltage at the output node 310. In particular, the control unit controls the change in the voltage at the drain of the differential transistor M5 to be smaller than the change in the voltage at the output node 310 when an inversion occurs in relative magnitude relation between the magnitude of the voltage at the gate of the pixel transistor M3 and the magnitude of the voltage at the gate of the differential transistor M5. In this case, the change in the voltage at the output node 310 may be defined as the difference between the first voltage and the second voltage described above.

The control unit may include a current mirror circuit. The current mirror circuit includes at least two transistors each having a gate connected to a gate of the other one of the two transistors. A drain of one of the two transistors is electrically connected to the differential transistor M5.

The control unit may include a switch element that connecting the gate and the drain of the other one of the two transistors, the other one being different from one having the drain electrically connected to the differential transistor M5. Using this switch element, it is possible to switch between the first operation and the second operation described above. In other words, the first operation and the second operation may be switched in response to turning on/off of the state of the switch elements.

As described above, the output circuit 105 includes the control unit that reduces the change in the voltage at the drain of the differential transistor M5. This configuration allows a reduction in the change in the reference signal due to the change in the voltage at the drain of the differential transistor M5. As a result, it is possible to improve the accuracy of the signal output from the photoelectric conversion apparatus.

Figure 4:
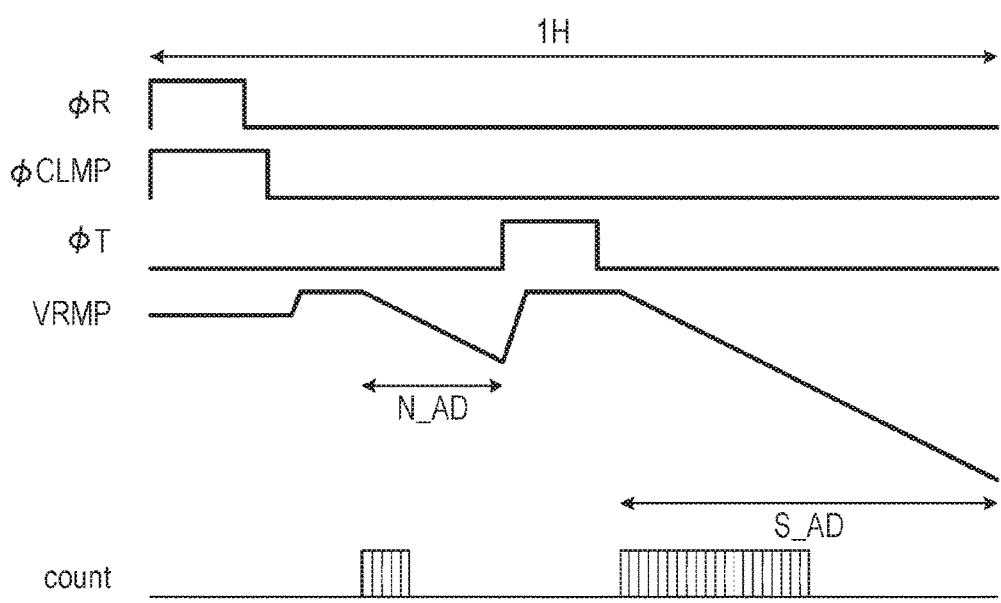
FIG. 4 is a diagram schematically illustrating a timing chart in terms of drive signals in a photoelectric conversion apparatus.

Next, driving of the photoelectric conversion apparatus according to the present embodiment is described below. FIG. 4 is a diagram schematically illustrating a timing chart in terms of drive signals in the photoelectric conversion apparatus. FIG. 4 shows drive signals for one horizontal scanning period (1H period) during which a signal is read out from one pixel row. When a drive signal is at a high level, transistors to which this drive signal is supplied are turned on. When a drive signal is at a low level, transistors to which this drive signal is supplied are turned off. The specific voltage of the high level and that of the low level are determined depending on the conductivity type of transistors.

In the present embodiment, when the drive signal φCLMP is at the high level, the output circuit 105 operates as a current source. When the drive signal φCLMP is at the low level, the output circuit 105 operates as a current detection circuit.

First, the drive signal φR and the drive signal φCLMP are set to the high level. As a result, the reset transistor M1 and the clamp switch element SW1 go into an on-state, that is, they turn on. The voltage at the FD node is reset to a particular voltage such as a power supply voltage VDD (hereinafter referred to as a reset level). At the same time, the output circuit 105 outputs a voltage based on the voltage at the FD node (hereinafter referred to as a clamp level) to the gate of the differential transistor M5 and the clamp capacitor element C1. That is, the output circuit 105 performs the first operation in which the voltage based on the voltage at the gate of the pixel transistor M3 is output to the gate of the differential transistor M5.

Thereafter, the drive signal φR and the drive signal φCLMP are sequentially changed to the low level. As a result, the reset level is held by the FD node, and the clamp level is held by the clamp capacitor element C1. By turning off the reset transistor M1 before turning off the clamp switch element SW1, thermal noise generated in the reset transistor M1 is reflected in the clamp level. In a state immediately after the clamp switch element SW1 turns off, the voltage at the FD node, that is the voltage at the gate of the pixel transistor M3 is nearly equal to the voltage at the gate of the differential transistor M5.

Subsequently, the reference signal VRMP is changed to a higher voltage. As a result, the voltage at the gate of the differential transistor M5 becomes higher than the voltage at the gate of the pixel transistor M3. Because the pixel transistor M3 and the differential transistor M5 form a differential pair, most of the current of the tail current source IS1 flows through the differential transistor M5.

Next, ramp down is started on the reference signal VRMP. The ramp down is an operation of gradually reducing the voltage of the reference signal VRMP. At a certain timing, an inversion occurs in relationship between the magnitude of the voltage at the gate of the pixel transistor M3 and the magnitude of the voltage at the gate of the differential transistor M5. After the inversion occurs in this relationship, most of the current of the tail current source IS1 flows through the pixel transistor M3, and the current of the differential transistor M5 decreases.

The output circuit 105 detects a change in the current of the differential transistor M5. More specifically, at the timing when the reduction occurs in the current of the differential transistor M5, the output circuit 105 outputs a signal indicating the occurrence of the change in the current, as a control signal, to the output node 310. In other words, the output circuit 105 performs the second operation in which the signal based on the result of the comparison between the voltage at the gate of the pixel transistor M3 and the voltage at the gate of the differential transistor M5 is output to the output node 310.

In the photoelectric conversion apparatus shown in FIG. 1, the control signal controls the counter 106 to measure a time from the start of the ramp down to the occurrence of the inversion in the voltage magnitude relationship. In the photoelectric conversion apparatus shown in FIG. 2, the control signal controls the latch 110 to measure a time from the start of the ramp down to the occurrence of the inversion in the voltage magnitude relationship. After a predetermined period has elapsed since the start of the ramp down, the AD conversion of the reset level is ended. The period in which the AD conversion of the reset level is performed is denoted by N_AD in FIG. 4.

Thereafter, the reference signal VRMP is reset. By changing the drive signal φT to the high level, the transfer transistor M2 is turned on, and an electric charge generated in the photoelectric conversion element PD is transferred to the FD node. In the present description, the voltage at the FD node in a state after the charge has been transferred from the photoelectric conversion element PD to the FD node is referred to as an optical signal level.

After the drive signal φT is changed to the low level, the ramp down of the reference signal VRMP is started. Subsequently, the AD conversion of the optical signal level is performed in a similar manner to the AD conversion of the reset level. The period in which the AD conversion of the optical signal level is performed is denoted by S_AD in FIG. 4.

Although a detailed description is not given here, in the photoelectric conversion apparatus, digital correlated double sampling (CDS) may be performed by subtracting a code value obtained by AD-converting the reset level from a code value obtained by AD-converting the optical signal level.

In the present embodiment, the output circuit 105 includes the control unit that reduces the change in the voltage at the drain of the differential transistor M5. Therefore, in the operation described above, when an inversion occurs in the voltage relationship, a change in the voltage at the drain of the differential transistor M5 is suppressed. Thus, it is possible to reduce the change in the reference signal VRMP. As a result, it is possible to increase the accuracy of the digital signal output from the photoelectric conversion apparatus.

In the aspect described above, the differential transistor M5 forms a differential pair together with the pixel transistor M3 in each of the pixels 100. However, in an alternative aspect, the differential transistor M5 may form a differential pair together with a transistor which is not included in any pixel 100. For example, a signal output from each pixel 100 is output by an amplifier unit included in each pixel 100 to a common signal line. Then the signal on the common output line is input to the gate of the above-described transistor forming the differential pair together with the differential transistor M5. Also in the alternative aspect described above, it is possible to increase the accuracy of the signal output from the photoelectric conversion apparatus.

Some embodiments according to the present disclosure are described below. Unless otherwise described, the aspects described above are applied to all embodiments. Note that a part of an embodiment may be replaced with a part of another embodiment, or a part of an embodiment may be added to another embodiment.

First Embodiment

A photoelectric conversion apparatus according to a first embodiment is described below. The first embodiment is characterized in that the control unit of the output circuit 105 includes a current mirror circuit.

Figure 5:
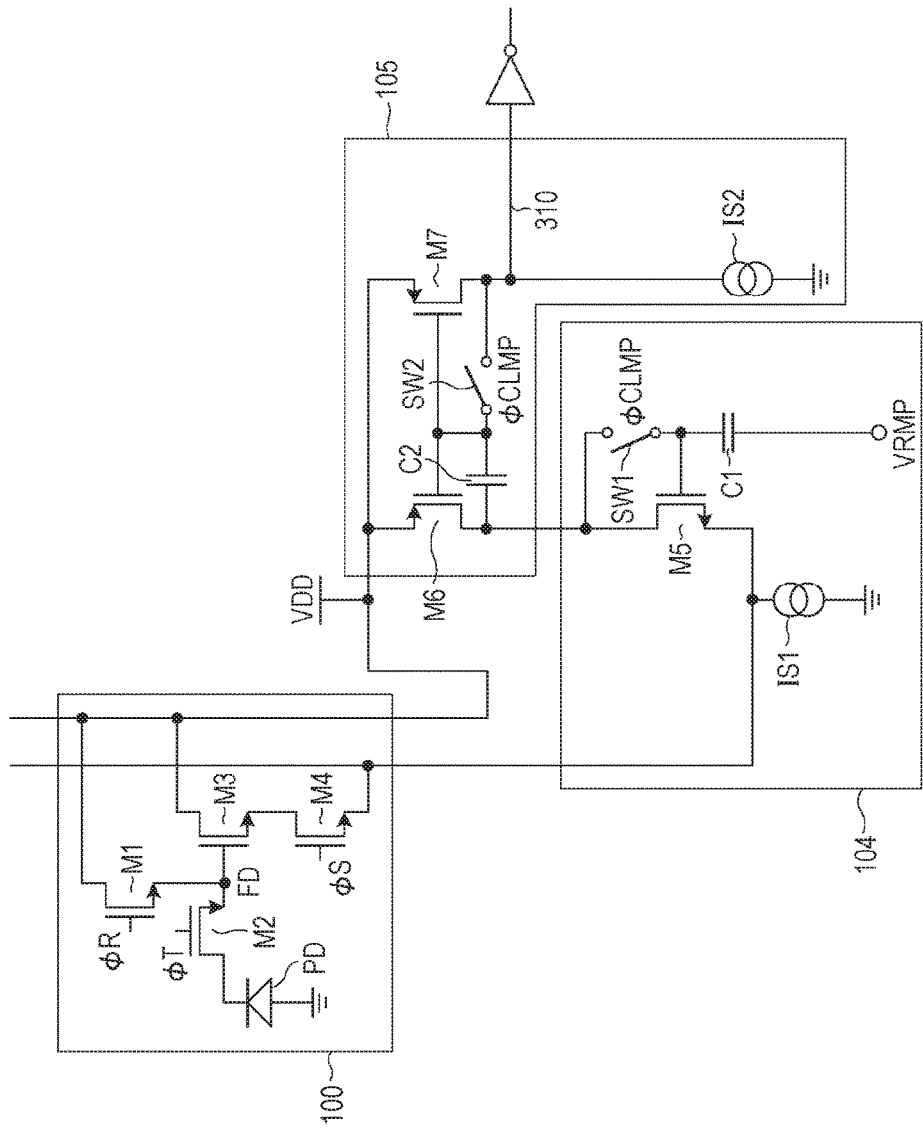
FIG. 5 is a diagram illustrating a circuit configuration of a photoelectric conversion apparatus.

FIG. 5 illustrates configurations of the pixel 100, the comparator circuit 104, and the output circuit 105 of the photoelectric conversion apparatus. For simplicity of illustration, only one pixel 100 is shown in FIG. 5. Parts similar in function to those in FIG. 3 are denoted by similar reference numerals, and a further detailed description thereof is omitted.

The control unit of the output circuit 105 includes a current mirror circuit including a P-channel type MOS transistor M6 and a P-channel type MOS transistor M7. A drain of the transistor M6 is electrically connected to a drain of the differential transistor M5. A gate of the transistor M6 and a gate of the transistor M7 are connected together.

When the output circuit 105 performs the first operation, the current mirror circuit formed with the transistors M6 and M7 mirrors a current of the transistor M7 to the transistor M6. When the output circuit 105 performs the second operation, the current mirror circuit mirrors a current of the transistor M6 to the transistor M7.

In the present embodiment, in the first operation, the current mirror circuit operates as a current source that supplies a current from the transistor M6 to the differential transistor M5. In the second operation, the current mirror circuit operates as a current detection circuit that mirrors the current input to the transistor M6 from the differential transistor M5 to the transistor M7.

The control unit of the output circuit 105 includes a capacitor element C2. The capacitor element C2 has a first terminal electrically connected to the drain of the transistor M6 and a second terminal electrically connected to the gate of the transistor M6. Via the capacitor element C2, the drain and the gate of the transistor M6 are AC-coupled to each other, and thus it is possible to mirror the current of the transistor M6 to the transistor M7.

The control unit of the output circuit 105 includes a first switch element SW2. The first switch element SW2 connects the gate and the drain of the transistor M7. By turning on the first switch element SW2, the current mirror circuit is capable of mirroring the current of the transistor M7 to the transistor M6. By turning off the first switch element SW2, the current mirror circuit is capable of mirroring the current of the transistor M6 to the transistor M7. That is, the first switch element SW2 switches between the first operation and the second operation performed with the output circuit 105.

Note that the capacitance of the capacitor element C2 is greater than the coupling capacitance between two ends of the first switch element SW2 in a state in which the first switch element SW2 is in the off-state. In a case where a MOS transistor is used as the first switch element SW2, the two ends of the first switch element SW2 are the source and the drain of this MOS transistor. The configuration described above makes it possible to improve the stability of the operation of the current mirror circuit.

The clamp circuit 300 includes a clamp switch element SW1 and a clamp capacitor element C1. In the present embodiment, the clamp switch element SW1 connects the gate and the drain of the differential transistor M5. The clamp switch element SW1 may electrically connect the gate and the drain of the differential transistor M5 via a common gate circuit.

It may be desirable that the clamp switch element SW1 and the first switch element SW2 operate in the same phase. In the present embodiment, by controlling the clamp switch element SW1 and the first switch element SW2 using a common drive signal φCLMP, such that the clamp switch element SW1 and the first switch element SW2 operate in the same phase.

In the present embodiment, the output circuit 105 includes a reference current source IS2 connected to the output node 310. The reference current source IS2 outputs a reference current to the transistor M7. The output node 310 is connected to an inverter circuit.

In the present embodiment, the photoelectric conversion apparatus is driven by drive signals shown in FIG. 4. During a period in which the drive signal φCLMP is at the high level, the clamp switch element SW1 and the first switch element SW2 are turned on. The reference current from the reference current source IS2 is output to the differential transistor M5 via the current mirror formed with the transistors M6 and M7. That is, the transistor M6 operates as a current source that supplies a current to the differential transistor M5.

The clamp switch element SW1 connects the gate and the drain of the differential transistor M5. As a result, the pixel transistor M3, the differential transistor M5, and the tail current source IS1 operate as a voltage follower in which a current source provided by the transistor M6 functions as a load. Thus, the voltage at the FD node is output to the gate of the differential transistor M5 and the clamp capacitor element C1. In other words, the output circuit 105 performs the first operation in which the voltage based on the voltage at the gate of the pixel transistor M3 is output to the gate of the differential transistor M5.

When the drive signal φCLMP goes to the low level, the clamp switch element SW1 and the first switch element SW2 turn off. Thereafter, the output circuit 105 performs the second operation in which the voltage at the gate of the pixel transistor M3 is compared with the voltage at the gate of the differential transistor M5.

As described above, the gate and the drain of the transistor M6 are AC-coupled to each other via the capacitor element C2. Therefore, a current flowing through the differential transistor M5 is mirrored from the transistor M6 to the transistor M7. The voltage at the output node 310 changes depending on the relationship between the magnitude of the mirrored current and the reference current from the reference current source IS2. That is, a signal is output to the output node 310 based on a result of the comparison.

Here, examples of values of various elements are described. For example, the transistors M6 and M7 forming the current mirror circuit are substantially equal in size. An amount of a current I_IS1 of the tail current source and an amount of a current I_IS2 of the reference current source IS2 substantially satisfy a relationship I_IS1=2×I_IS2.

In the conditions described above, in the first operation, a current with a magnitude nearly equal to one-half the amount of the current I_IS1 of the tail current source IS1 flows through each of the pixel transistor M3 and the differential transistor M5, that is, a current substantially equal to the amount of current I_IS2 flows through each of them. In the second operation, when the voltage at the gate of the differential transistor M5 is higher than the voltage at the gate of the pixel transistor M3, most of the current of the tail current source IS1 flows through the differential transistor M5, and substantially no current flows through the pixel transistor M3. Therefore, a current with substantially the same magnitude as that of the tail current source IS1 flows through the transistor M7. As a result, the voltage at the drain of the transistor M7, that is the voltage at the output node 310 becomes nearly equal to the power supply voltage VDD.

When the reference signal ramps down, the voltage at the gate of the differential transistor M5 becomes lower than the voltage at the gate of the pixel transistor M3. In this state, most of the current of the tail current source IS1 flows through the pixel transistor M3, and the current of the differential transistor M5 becomes substantially equal to zero. Therefore, the current of the transistor M7 also becomes substantially equal to zero. As a result, the voltage at the drain of the transistor M7, that is, the voltage at the output node 310 becomes nearly equal to the ground voltage.

As described above, the output circuit 105 detects a change in the current of the differential transistor M5. In this operation, the transistor M6 functions as an input of the current mirror circuit. Even a change occurs in the drain current of the differential transistor M5, no significant change occurs in the voltage at the drain of the transistor M6. In other words, the current mirror circuit controls the change in the voltage at the drain of the differential transistor M5 so as to be smaller than the change in the voltage at the output node. Thus, it is possible to reduce the change in the voltage of the reference signal VRMP. As a result, the present embodiment allows it to improve the accuracy of the signal output from the photoelectric conversion apparatus.

In a comparative example of the photoelectric conversion apparatus disclosed in Patent Document 1, after the clamp operation ends, the PMOS transistor 203 still operates as a constant current source. In this situation, the voltage at the drain of the differential transistor 201 is read out as an output. Therefore, when an inversion in the voltage relationship occurs, a great change occurs in the drain voltage of the differential transistor 201. This voltage change causes a change in the voltage of the reference signal, which, as a result, may cause a reduction in image quality.

As described above, the present embodiment allows it to improve the accuracy of the signal output from the photoelectric conversion apparatus.

Second Embodiment

A photoelectric conversion apparatus according to a second embodiment is described below. This embodiment is different from the first embodiment in that the output circuit 105 includes a current source IS3. Differences from the first embodiment are described below but a description of similar parts to those in the first embodiment is omitted.

Figure 6:
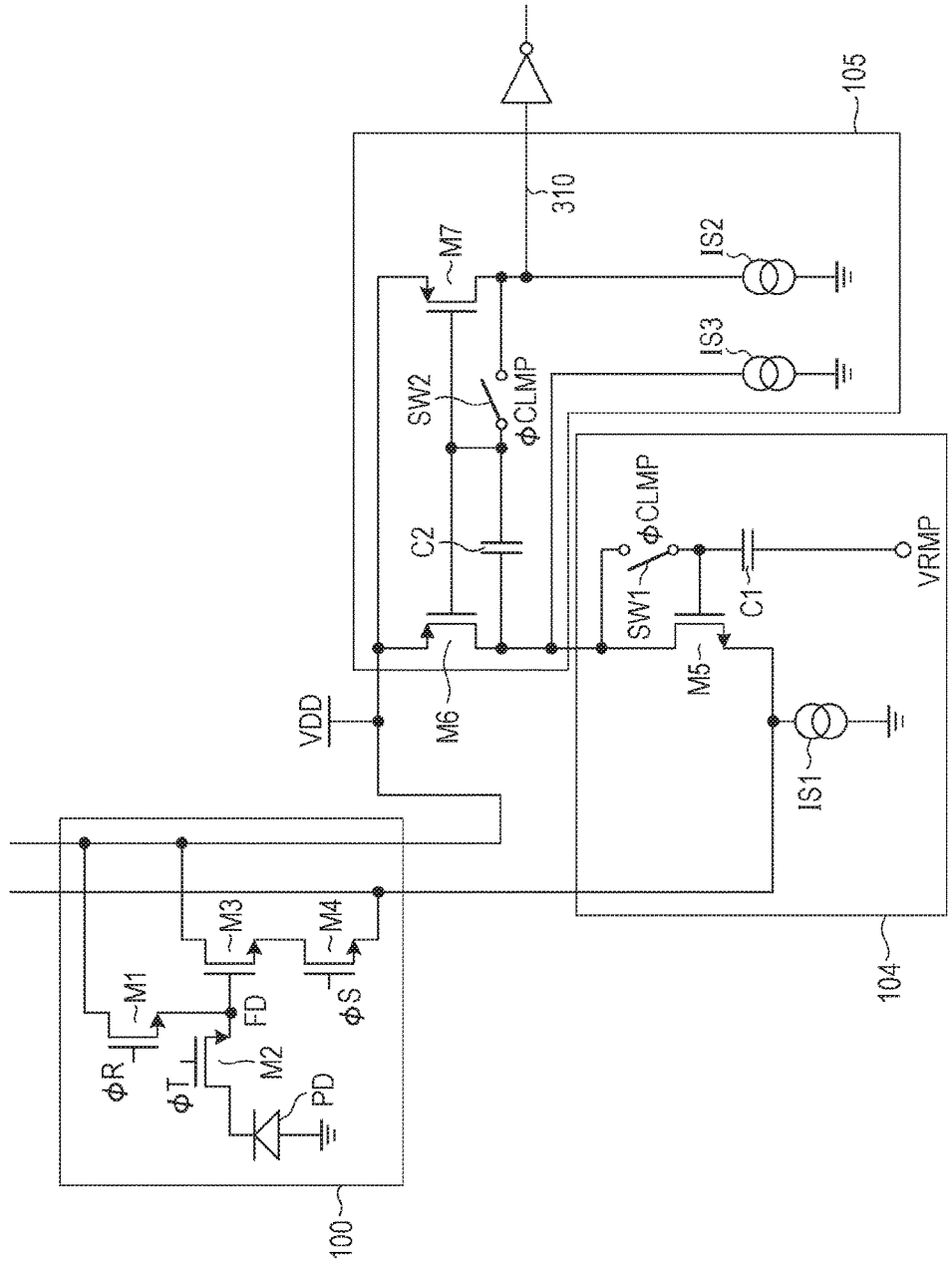
FIG. 6 is a diagram illustrating a circuit configuration of a photoelectric conversion apparatus.

FIG. 6 illustrates configurations of the pixel 100, the comparator circuit 104, and the output circuit 105 of the photoelectric conversion apparatus. For simplicity of illustration, only one pixel 100 is shown in FIG. 6. Parts similar in function to those in FIG. 3 or FIG. 5 are denoted by similar reference numerals, and a further detailed description thereof is omitted.

The output circuit 105 includes the current source IS3. The current source IS3 is connected to the drain of the transistor M6 of the current mirror circuit. The provision of the current source IS3 makes it possible to prevent the current of the transistor M6 from becoming 0 when the current of the differential transistor M5 becomes substantially equal to 0. This allows an improvement in response characteristics of the output circuit 105.

Here, examples of values of various elements are described. It may be desirable that the amount of the current I_IS3 of the current source IS3 is smaller than the amount of the current I_IS1 of the tail current source IS1 and the amount of the current I_IS2 of the reference current source IS2. In a case where the transistors M6 and M7 forming the current mirror circuit are nearly equal in size, it may be desirable that the amount of the current I_IS1, the amount of the current I_IS2, and the amount of the current I_IS3 substantially satisfy a relationship I_IS1=2×(I_IS2−I_IS3).

As described above, the present embodiment allows it to increase the operation speed of the photoelectric conversion apparatus. Furthermore, as with the first embodiment, the present embodiment allows it to improve the accuracy of the signal output from the photoelectric conversion apparatus.

Third Embodiment

A photoelectric conversion apparatus according to a third embodiment is described below. The third embodiment is different from the first and second embodiments in that the capacitor element C2 of the control unit of the output circuit 105 is replaced with a second switch element SW3. Differences from the first and second embodiments are described below but a description of similar parts to those in the first or second embodiment is omitted.

Figure 7:
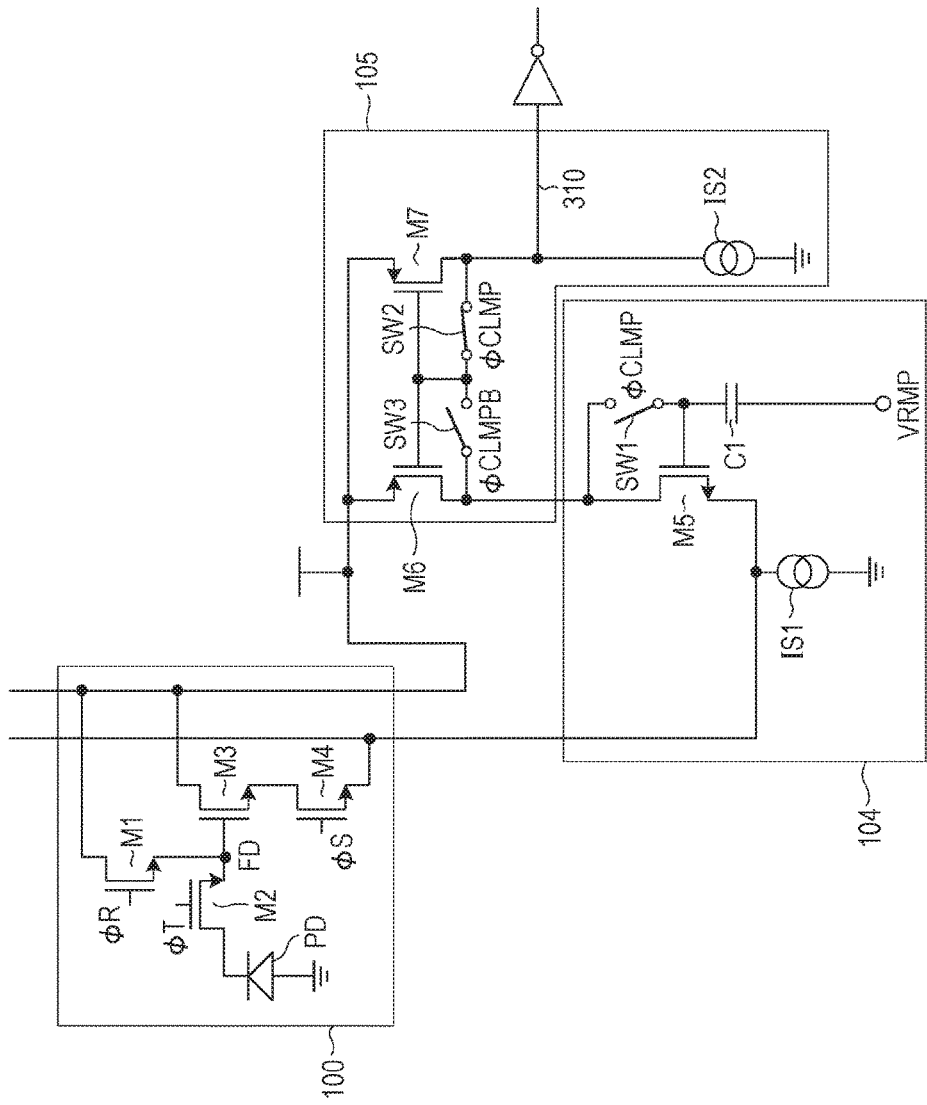
FIG. 7 is a diagram illustrating a circuit configuration of a photoelectric conversion apparatus.

FIG. 7 illustrates configurations of the pixel 100, the comparator circuit 104, and the output circuit 105 of the photoelectric conversion apparatus. For simplicity of illustration, only one pixel 100 is shown in FIG. 7. Parts similar in function to those in FIG. 3, FIG. 5, or FIG. 6 are denoted by similar reference numerals, and a further detailed description thereof is omitted.

The control unit of the output circuit 105 includes a current mirror circuit including a P-channel type MOS transistor M6 and a P-channel type MOS transistor M7. A drain of the transistor M6 is electrically connected to a drain of the differential transistor M5. A gate of the transistor M6 and a gate of the transistor M7 are connected together.

When the output circuit 105 performs the first operation, the current mirror circuit formed with the transistors M6 and M7 mirrors a current of the transistor M7 to the transistor M6. When the output circuit 105 performs the second operation, the current mirror circuit mirrors a current of the transistor M6 to the transistor M7.

In the present embodiment, in the first operation, the current mirror circuit operates as a current source that supplies a current from the transistor M6 to the differential transistor M5. In the second operation, the current mirror circuit operates as a current detection circuit that mirrors the current input to the transistor M6 from the differential transistor M5 to the transistor M7.

The control unit of the output circuit 105 includes a first switch element SW2 and a second switch element SW3. The first switch element SW2 connects the gate and the drain of the transistor M7. The second switch element SW3 electrically connects the drain and the gate of the transistor M6.

In the present embodiment, the first switch element SW2 and the second switch element SW3 operate in an exclusive manner. In other words, when the first switch element SW2 is in an on-state the second switch element SW3 turns off. On the other hand, when the first switch element SW2 is in an off-state, the second switch element SW3 turns on. More specifically, the first switch element SW2 is controlled by a drive signal φCLMP. The second switch element SW3 is controlled by a drive signal φCLMPB which is opposite in phase to the drive signal φCLMP.

By turning on the first switch element SW2 and turning off the second switch element SW2, the current mirror circuit is capable of mirroring the current of the transistor M7 to the transistor M6. By turning off the first switch element SW2 and turning on the second switch element SW2, the current mirror circuit is capable of mirroring the current of the transistor M6 to the transistor M7. That is, the first switch element SW2 and the second switch element SW3 switch between the first operation and the second operation performed with the output circuit 105.

Thus, as with the first embodiment, the present embodiment allows it to improve the accuracy of the signal output from the photoelectric conversion apparatus.

Fourth Embodiment

A photoelectric conversion apparatus according to a fourth embodiment is described below. The fourth embodiment is different from the first to third embodiments in that the output circuit 105 includes a common-source amplifier circuit. Differences from the first to third embodiments are described below but a description of similar parts to those of any one of the first to third embodiments is omitted.

Figure 8:
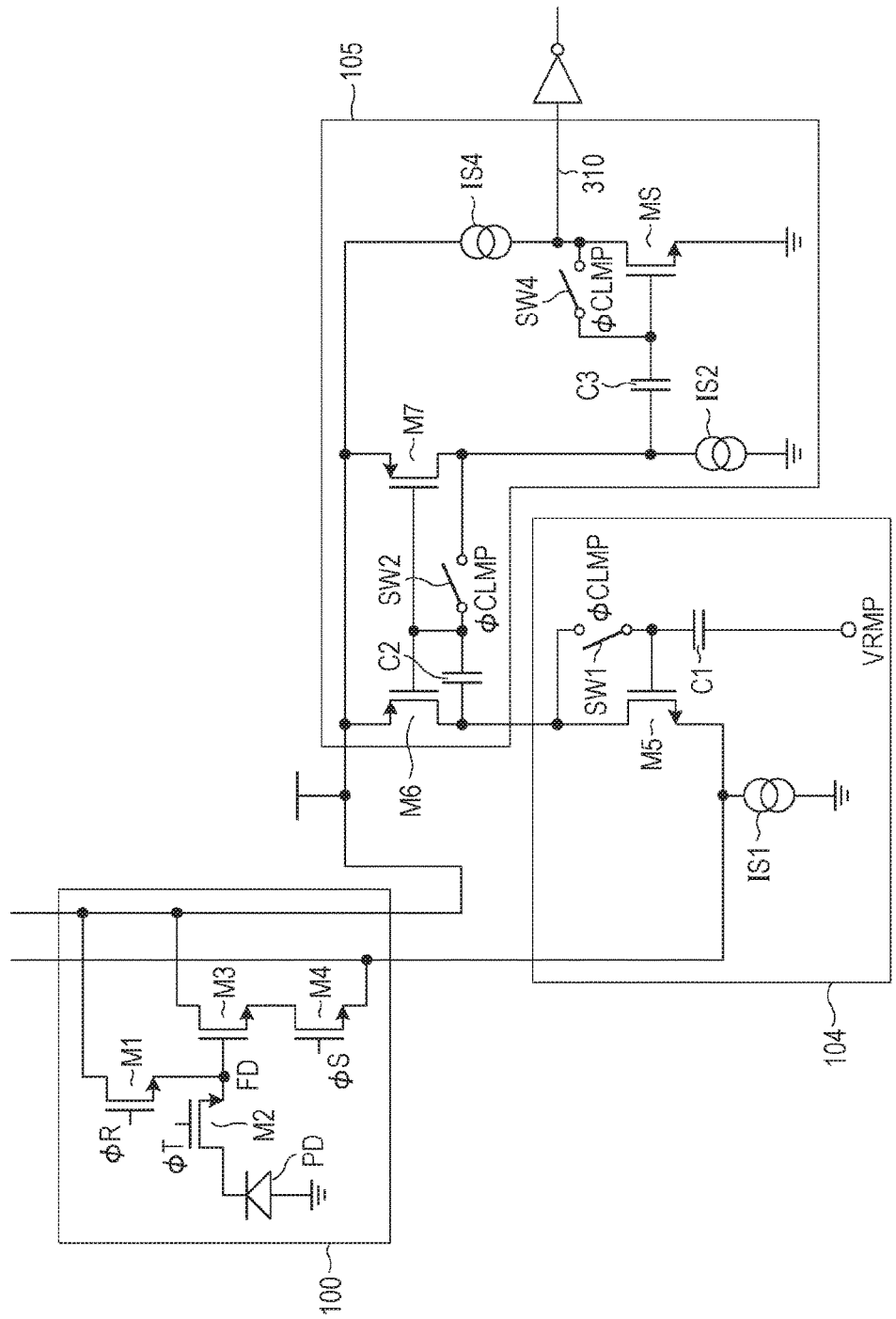
FIG. 8 is a diagram illustrating a circuit configuration of a photoelectric conversion apparatus.

FIG. 8 illustrates configurations of the pixel 100, the comparator circuit 104, and the output circuit 105 of the photoelectric conversion apparatus. For simplicity of illustration, only one pixel 100 is shown in FIG. 8. Parts similar in function to those of one of FIG. 3 and FIGS. 5 to 7 are denoted by similar reference numerals, and a further detailed description thereof is omitted.

The output circuit 105 includes a common-source amplifier circuit including a current source IS4 and an N-channel type MOS transistor MS. An input node of the common-source amplifier circuit is connected to the drain of the transistor M7 via a capacitor element C3. The output node of the common-source amplifier circuit functions as the output node 310 of the output circuit 105.

The output circuit 105 further includes a third switch element SW4. The provision of the third switch element SW4 makes it possible to, in the first operation, clamp the voltage of the input node of the common-source amplifier circuit. The third switch element SW4, as with the clamp switch element SW1 and the first switch element SW2, is controlled by the drive signal φCLMP. During a period in which the drive signal φCLMP is at the high level, the clamp switch element SW1, the first switch element SW2, and the third switch element SW4 are turned on, and thus the clamp capacitor element C1, the capacitor element C2, and the capacitor element C3 are clamped at their respective operation points.

In the present embodiment, as described above, the output circuit 105 includes the common-source amplifier circuit. This makes is possible to increase the gain in the second operation. Furthermore, as with the first embodiment, the present embodiment allows it to improve the accuracy of the signal output from the photoelectric conversion apparatus.

Fifth Embodiment

A photoelectric conversion apparatus according to a fifth embodiment is described below. The fifth embodiment is different from the first to fourth embodiments in that the output circuit 105 includes a plurality of current mirror circuits. Differences from the first to fourth embodiments are described below but a description of similar parts to those of any one of the first to fourth embodiments is omitted.

Figure 9:
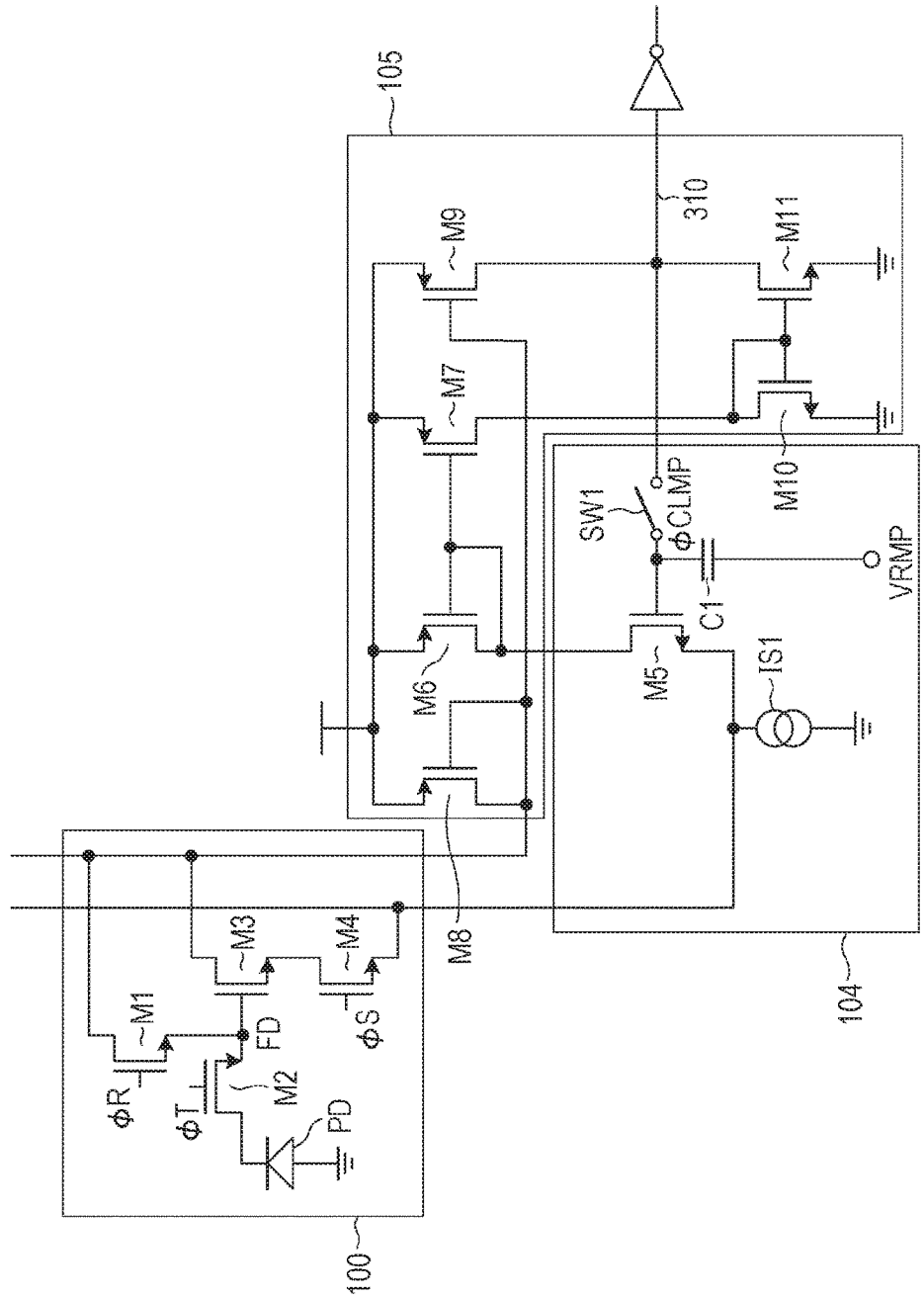
FIG. 9 is a diagram illustrating a circuit configuration of a photoelectric conversion apparatus.

FIG. 9 illustrates configurations of the pixel 100, the comparator circuit 104, and the output circuit 105 of the photoelectric conversion apparatus. For simplicity of illustration, only one pixel 100 is shown in FIG. 9. Parts similar in function to those of one of FIG. 3 and FIGS. 5 to 8 are denoted by similar reference numerals, and a further detailed description thereof is omitted.

The control unit of the output circuit 105 includes a first current mirror circuit including a P-channel type MOS transistor M8 and a P-channel type MOS transistor M9. A drain of the transistor M8 is electrically connected to a drain of the pixel transistor M3. A gate of the transistor M8 and a gate of the transistor M9 are connected together. The first current mirror circuit outputs a current of the pixel transistor M3 to a drain, functioning as a first mirror output node, of the transistor M9.

The control unit of the output circuit 105 includes a second current mirror circuit including a P-channel type MOS transistor M6 and a P-channel type MOS transistor M7. A drain of the transistor M6 is electrically connected to a drain of the differential transistor M5. A gate of the transistor M6 and a gate of the transistor M7 are connected together. The second current mirror circuit outputs a current of the differential transistor M5 to a drain, functioning as a second mirror output node, of the transistor M7.

The control unit of the output circuit 105 further includes a third current mirror circuit including an N-channel type MOS transistor M10 and an N-channel type MOS transistor M11. A drain of the transistor M10 is electrically connected to a drain of the transistor M7. A gate of the transistor M10 and a gate of the transistor M11 are connected together. The third current mirror circuit outputs a second mirror output node (the drain of the transistor M7) to a first mirror output node (the drain of the transistor M9).

A node via which the drain of the transistor M9 and the drain of the transistor M11 are connected functions as the output node 310 of the output circuit 105. The clamp switch element SW1 connects the gate of the differential transistor M5 and the output node 310.

When the clamp switch element SW1 turns on, the voltage at the output node 310 is fed back to the gate of the differential transistor M5. That is, the pixel transistor M3 and the differential transistor M5 operate as a voltage follower. As described above, the output circuit 105 performs the first operation in which the voltage based on the voltage at the gate of the pixel transistor M3 is output to the gate of the differential transistor M5.

When the clamp switch element SW1 turns off, a current of the pixel transistor M3 and a current of the differential transistor M5 are output to the output node 310 via the transistor M9 and the transistor M11, respectively. The current of the pixel transistor M3 and the current of the differential transistor M5 are compared at the output node 310, and a signal representing a result of the comparison is output to the output node 310. The relationship between the current of the pixel transistor M3 and the current of the differential transistor M5 is determined by the relationship between the voltages at the gates of these two transistors. As described above, the output circuit 105 performs the second operation in which the voltage at the gate of the pixel transistor M3 and the voltage at the gate of the differential transistor M5 are compared, and a signal based on the result of the comparison is output.

Thus, as with the first embodiment, the present embodiment allows it to improve the accuracy of the signal output from the photoelectric conversion apparatus.

Sixth Embodiment

A photoelectric conversion apparatus according to an embodiment 6 is described below. The sixth embodiment is different from the first to fifth embodiments in that the output circuit 105 includes a current mirror circuit and a common gate circuit. Differences from the first to fifth embodiments are described below but a description of similar parts to those of any one of the first to fifth embodiments is omitted.

Figure 10:
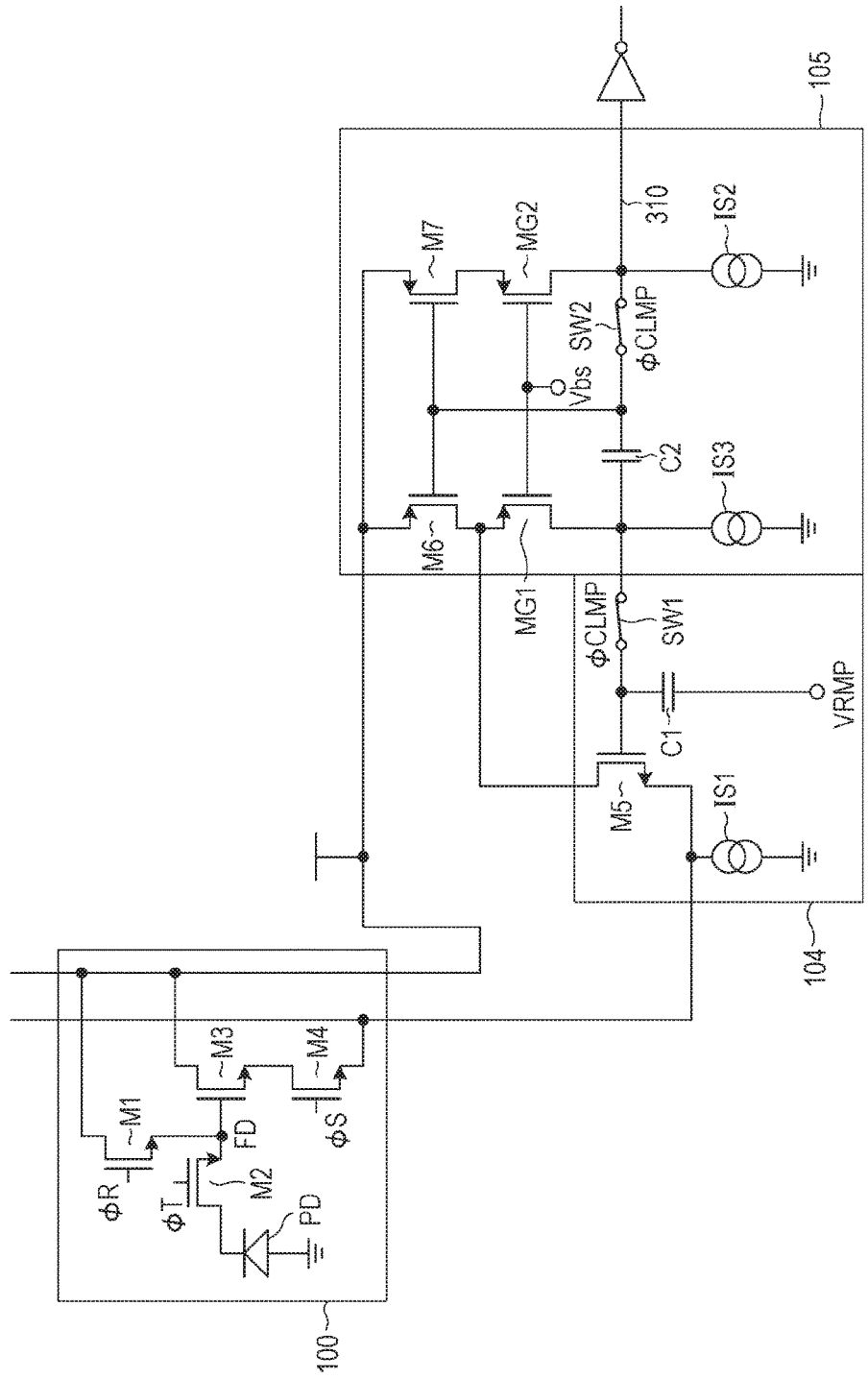
FIG. 10 is a diagram illustrating a circuit configuration of a photoelectric conversion apparatus.

FIG. 10 illustrates configurations of the pixel 100, the comparator circuit 104, and the output circuit 105 of the photoelectric conversion apparatus. For simplicity of illustration, only one pixel 100 is shown in FIG. 10. Parts similar in function to those of one of FIG. 3 and FIGS. 5 to 9 are denoted by similar reference numerals, and a further detailed description thereof is omitted.

The control unit of the output circuit 105 includes a current mirror circuit including a P-channel type MOS transistor M6 and a P-channel type MOS transistor M7. A drain of the transistor M6 is electrically connected to a drain of the differential transistor M5. A gate of the transistor M6 and a gate of the transistor M7 are connected together.

The current mirror circuit further includes a P-channel type MOS transistor MG1 and a P-channel type MOS transistor MG2. The transistor MG1 and the transistor MG2 are respectively cascode-connected to the transistor M6 and the transistor M7. A bias voltage Vbs is supplied to a gate of the transistor MG1 and a gate of the transistor MG2. As a result, the transistor MG1 and the transistor MG2 each form a common gate circuit.

When the output circuit 105 performs the first operation, the current mirror circuit formed with the transistors M6 and M7 mirrors a current of the transistor M7 to the transistor M6. When the output circuit 105 performs the second operation, the current mirror circuit mirrors a current of the transistor M6 to the transistor M7.

In the present embodiment, in the first operation, the current mirror circuit operates as a current source that supplies a current from the transistor M6 to the differential transistor M5. In the second operation, the current mirror circuit operates as a current detection circuit that mirrors the current input to the transistor M6 from the differential transistor M5 to the transistor M7.

The control unit of the output circuit 105 includes a capacitor element C2. The capacitor element C2 has a first terminal and a second terminal. The first terminal of the capacitor element C2 is electrically connected to the drain of the transistor M6 via a common gate circuit (transistor MG1). The second terminal of the capacitor element C2 is electrically connected to the gate of the transistor M6. Via the capacitor element C2, the drain and the gate of the transistor M6 are AC-coupled to each other, and thus it is possible to mirror the current of the transistor M6 to the transistor M7.

The control unit of the output circuit 105 includes a first switch element SW2. The first switch element SW2 electrically connects the gate and the drain of the transistor M7 via a common gate circuit (transistor MG2). By turning on the first switch element SW2, the current mirror circuit is capable of mirroring the current of the transistor M7 to the transistor M6. By turning off the first switch element SW2, the current mirror circuit is capable of mirroring the current of the transistor M6 to the transistor M7. That is, the first switch element SW2 switches between the first operation and the second operation performed with the output circuit 105.

Note that the capacitance of the capacitor element C2 is greater than the coupling capacitance between two ends of the first switch element SW2 in a state in which the first switch element SW2 is in the off-state. In a case where a MOS transistor is used as the first switch element SW2, the two ends of the first switch element SW2 are the source and the drain of this MOS transistor. The configuration described above makes it possible to improve the stability of the operation of the current mirror circuit.

The clamp circuit 300 includes a clamp switch element SW1 and a clamp capacitor element C1. In the present embodiment, the clamp switch element SW1 electrically connects the gate and the drain of the differential transistor M5 via the common gate circuit (transistor MG1).

It may be desirable that the clamp switch element SW1 and the first switch element SW2 operate in the same phase. In the present embodiment, the clamp switch element SW1 and the first switch element SW2 are controlled by a common drive signal φCLMP.

In the present embodiment, the output circuit 105 includes a reference current source IS2 connected to the output node 310. The reference current source IS2 outputs a reference current to the transistor M7. The output node 310 is connected to an inverter circuit.

In the present embodiment, the photoelectric conversion apparatus is driven by drive signals shown in FIG. 4. That is, in the present embodiment, driving is performed in a similar manner to the first embodiment.

Examples of values of various elements are described. For example, the transistors M6 and M7 forming the current mirror circuit are substantially equal in size. The amount of the current I_IS1 of the tail current source IS1, the amount of the current I_IS2 of the reference current source IS2, and the amount of the current I_IS3 of the current source IS3 substantially satisfy a relationship I_IS1=2×(I_IS2−I_IS3).

In the conditions described above, in the first operation, a current with a magnitude nearly equal to one-half the amount of current I_IS1 of the tail current source IS1 is passed through each of the pixel transistor M3 and the differential transistor M5, that is, the current flowing through each of these two transistors is nearly equal to the amount of a current (I_IS2−I_IS3). In the second operation, when the voltage at the gate of the differential transistor M5 is higher than the voltage at the gate of the pixel transistor M3, most of the current of the tail current source IS1 flows through the differential transistor M5, and substantially no current flows through the pixel transistor M3. Therefore, a current with substantially the same magnitude as that of the tail current source IS1 flows through the transistor M7. Because IS1=2× IS2, the voltage at the drain of the transistor M7, that is, the voltage at the output node 310 becomes nearly equal to the power supply voltage VDD.

When the reference signal ramps down, the voltage at the gate of the differential transistor M5 becomes lower than the voltage at the gate of the pixel transistor M3. In this state, most of the current of the tail current source IS1 flows through the pixel transistor M3, and the current of the differential transistor M5 becomes substantially equal to zero. Therefore, the current of the transistor M7 also becomes substantially equal to zero. As a result, the voltage at the drain of the transistor M7, that is, the voltage at the output node 310 becomes nearly equal to the ground voltage.

As described above, the output circuit 105 detects a change in the current of the differential transistor M5. In this operation, the transistor M6 functions as an input of the current mirror circuit. Even a change occurs in the drain current of the differential transistor M5, no significant change occurs in the voltage at the drain of the transistor M6. In other words, the current mirror circuit controls the change in the voltage at the drain of the differential transistor M5 so as to be smaller than the change in the voltage at the output node. Thus, it is possible to reduce the change in the voltage of the reference signal VRMP. As a result, the present embodiment allows it to improve the accuracy of the signal output from the photoelectric conversion apparatus.

In the present embodiment, the transistor M6 and the transistor M7 forming the current mirror circuit are each cascode-connected to a common gate circuit. This makes it possible to reduce the change in voltage at the drain of the differential transistor M5 more effectively than with the first embodiment.

Seventh Embodiment

A photoelectric conversion apparatus according to an embodiment 7 is described below. The seventh embodiment is different from the sixth embodiment in that the capacitor element C2 of the control unit of the output circuit 105 is replaced with a second switch element SW3. Differences from the sixth embodiment are described below but a description of similar parts to those in the sixth embodiment is omitted. Note that in the present embodiment, the second switch element SW3 functions in a similar manner to that of the second switch element SW3 according to the third embodiment.

Figure 11:
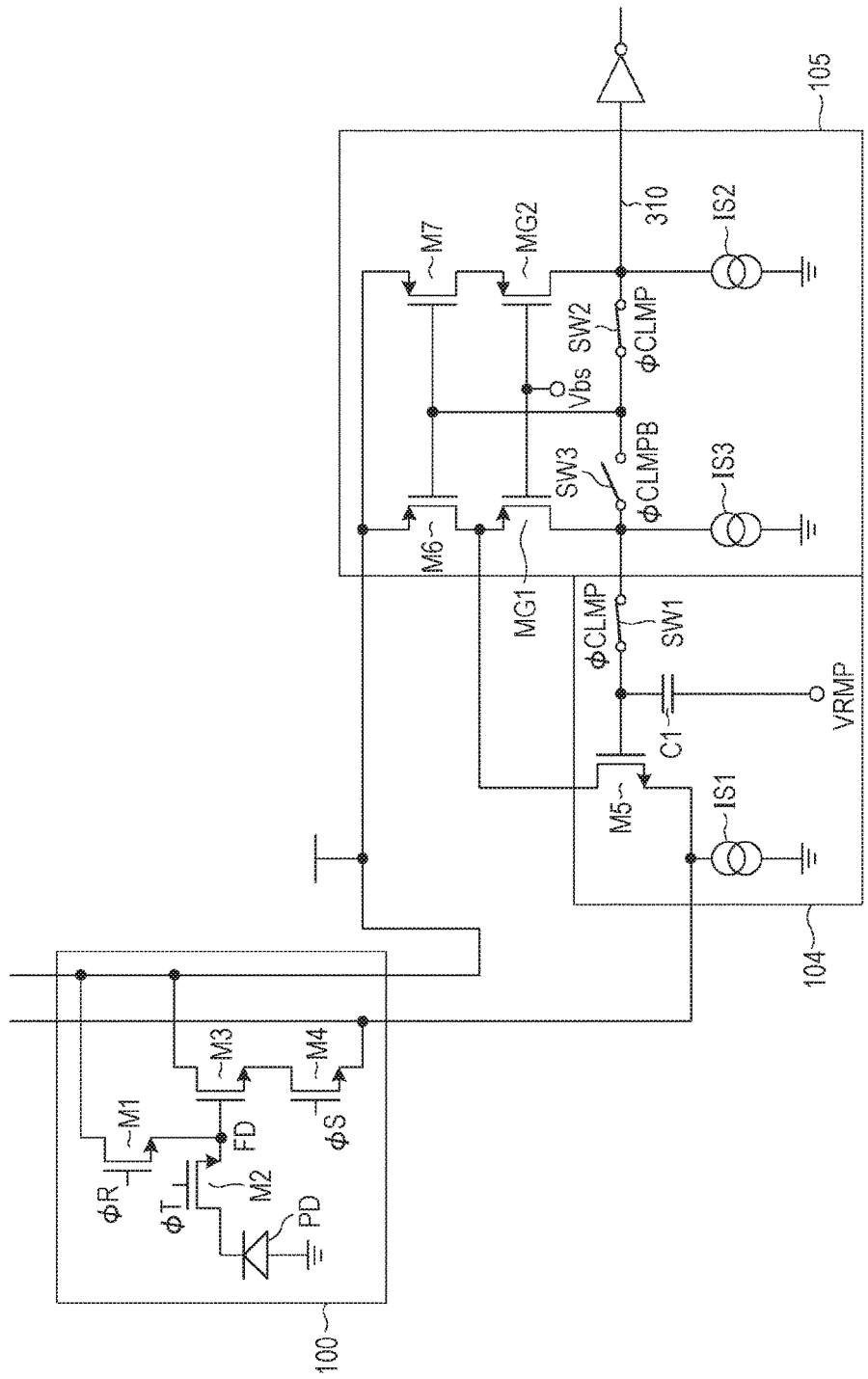
FIG. 11 is a diagram illustrating a circuit configuration of a photoelectric conversion apparatus.

FIG. 11 illustrates configurations of the pixel 100, the comparator circuit 104, and the output circuit 105 of the photoelectric conversion apparatus. For simplicity of illustration, only one pixel 100 is shown in FIG. 11. Parts similar in function to those in FIG. 7 or FIG. 10 are denoted by similar reference numerals, and a further detailed description thereof is omitted.

The control unit of the output circuit 105 includes a current mirror circuit including a P-channel type MOS transistor M6 and a P-channel type MOS transistor M7. A drain of the transistor M6 is electrically connected to a drain of the differential transistor M5. A gate of the transistor M6 and a gate of the transistor M7 are connected together.

The current mirror circuit further includes a P-channel type MOS transistor MG1 and a P-channel type MOS transistor MG2. The transistor MG1 and the transistor MG2 are respectively cascode-connected to the transistor M6 and the transistor M7. A bias voltage Vbs is supplied to a gate of the transistor MG1 and a gate of the transistor MG2. As a result, the transistor MG1 and the transistor MG2 each form a common gate circuit.

The control unit of the output circuit 105 includes a first switch element SW2 and a second switch element SW3. The first switch element SW2 electrically connects the gate and the drain of the transistor M7 via a common gate circuit (transistor MG2). The second switch element SW3 electrically connects the gate and the drain of the transistor M6 via a common gate circuit (transistor MG1).

In the present embodiment, the first switch element SW2 and the second switch element SW3 operate in an exclusive manner. In other words, when the first switch element SW2 is in an on-state the second switch element SW3 turns off. On the other hand, when the first switch element SW2 is in an off-state, the second switch element SW3 turns on. More specifically, the first switch element SW2 is controlled by a drive signal φCLMP. The second switch element SW3 is controlled by a drive signal φCLMPB which is opposite in phase to the drive signal φCLMP.

By turning on the first switch element SW2 and turning off the second switch element SW2, the current mirror circuit is capable of mirroring the current of the transistor M7 to the transistor M6. By turning off the first switch element SW2 and turning on the second switch element SW2, the current mirror circuit is capable of mirroring the current of the transistor M6 to the transistor M7. That is, the first switch element SW2 and the second switch element SW3 switch between the first operation and the second operation performed with the output circuit 105.

Thus, as with the sixth embodiment, the present embodiment allows it to improve the accuracy of the signal output from the photoelectric conversion apparatus.

Eighth Embodiment

A photoelectric conversion apparatus according to an embodiment 8 is described below. The eighth embodiment is different from the first to seventh embodiments in that the output circuit 105 includes a current mirror circuit and a load transistor. Differences from the first to seventh embodiments are described below, but a description of similar parts to those of any one of the first to seventh embodiments is omitted.

Figure 12:
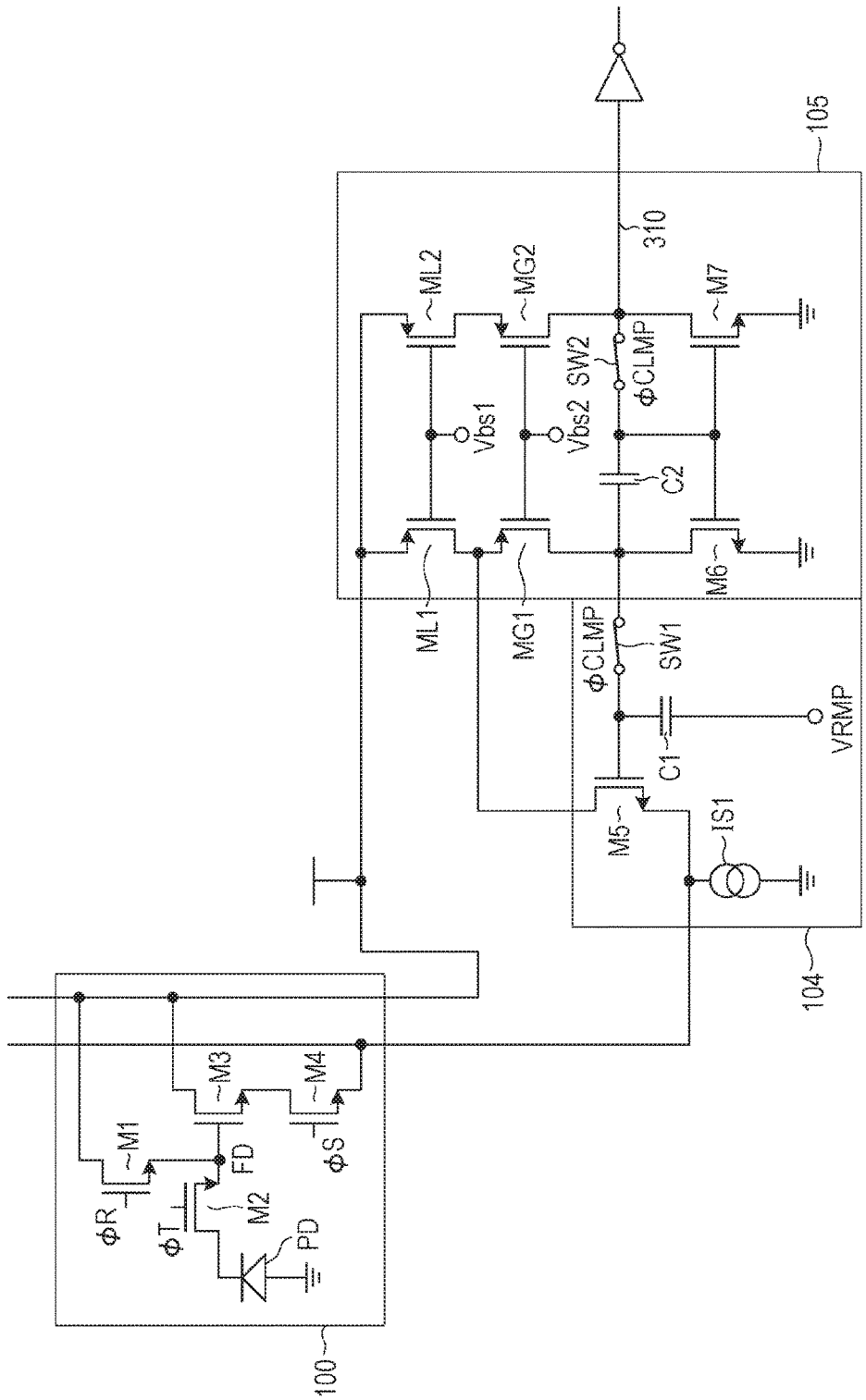
FIG. 12 is a diagram illustrating a circuit configuration of a photoelectric conversion apparatus.

FIG. 12 illustrates configurations of the pixel 100, the comparator circuit 104, and the output circuit 105 of the photoelectric conversion apparatus. For simplicity of illustration, only one pixel 100 is shown in FIG. 12. Parts similar in function to those of one of FIG. 3 and FIGS. 5 to 11 are denoted by similar reference numerals, and a further detailed description thereof is omitted.

The control unit of the output circuit 105 includes a current mirror circuit including an N-channel type MOS transistor M6 and an N-channel type MOS transistor M7. A drain of the transistor M6 is electrically connected to a drain of the differential transistor M5 via a common gate circuit (transistor MG1). A gate of the transistor M6 and a gate of the transistor M7 are connected together.

When the output circuit 105 performs the first operation, the current mirror circuit formed with the transistors M6 and M7 mirrors a current of the transistor M7 to the transistor M6. When the output circuit 105 performs the second operation, the current mirror circuit mirrors a current of the transistor M6 to the transistor M7.

The control unit of the output circuit 105 includes P-channel type load transistors ML1 and ML2. A drain of the load transistor ML1 is electrically connected to a drain of the differential transistor M5. A gate of the load transistor ML1 and a gate of the load transistor ML2 are connected together, and a bias voltage Vbs1 is supplied to the commonly connected gates. The load transistors ML1 and ML2 each operate as a current source.

In the present embodiment, connections of the differential transistor M5 and the transistor M6 are made so as to complementarily receive a current from the load transistor ML1. In other words, the differential transistor M5 and the transistor M6 are disposed in parallel in an electric path between the drain of the load transistor and the ground node. In this configuration, the sum of the current of the differential transistor M5 and the current of the transistor M6 is nearly equal to the current of the load transistor ML1.

In the present embodiment, in the first operation, the load transistor ML1 operates as a current source that supplies a current to the differential transistor M5. In the second operation, the current mirror circuit operates as a current detection circuit that mirrors the current input to the transistor M6 from the load transistor ML1 to the transistor M7.

The control unit of the output circuit 105 includes a capacitor element C2. The capacitor element C2 has a first terminal and a second terminal. The first terminal of the capacitor element C2 is electrically connected to the drain of the transistor M6. The second terminal of the capacitor element C2 is electrically connected to the gate of the transistor M6. Via the capacitor element C2, the drain and the gate of the transistor M6 are AC-coupled to each other, and thus it is possible to mirror the current of the transistor M6 to the transistor M7.

The control unit of the output circuit 105 includes a first switch element SW2. The first switch element SW2 electrically connects the gate and the drain of the transistor M7. By turning on the first switch element SW2, the current mirror circuit is capable of mirroring the current of the transistor M7 to the transistor M6. By turning off the first switch element SW2, the current mirror circuit is capable of mirroring the current of the transistor M6 to the transistor M7. That is, the first switch element SW2 switches between the first operation and the second operation performed with the output circuit 105.

The clamp circuit 300 includes a clamp switch element SW1 and a clamp capacitor element C1. In the present embodiment, the clamp switch element SW1 electrically connects the gate and the drain of the differential transistor M5 via the common gate circuit (transistor MG1).

In the present embodiment, the photoelectric conversion apparatus is driven by drive signals shown in FIG. 4. That is, in the present embodiment, driving is performed in a similar manner to the first embodiment.

Examples of values of various elements are described. For example, the transistors M6 and M7 forming the current mirror circuit are substantially equal in size. The amount of the current I_IS1 of the tail current source IS1, the amount of the current I_ML1 of the load transistor ML1, and the amount of the current I_ML2 of the load transistor ML2 substantially satisfy a relationship I_IS1=I_ML1=2×I_ML2.

In the conditions described above, in the first operation, a current with a magnitude nearly equal to one-half the amount of the current I_IS1 of the tail current source IS1 flows through each of the pixel transistor M3 and the differential transistor M5, that is, a current substantially equal to the amount of the current I_ML2 flows through each of them. In the second operation, when the voltage at the gate of the differential transistor M5 is higher than the voltage at the gate of the pixel transistor M3, most of the current of the tail current source IS1 flows through the differential transistor M5, and substantially no current flows through the pixel transistor M3. A current equal to the difference between the current of the load transistor ML1 and the current of the tail current source IS1 flows through the transistor M6. However, because I_IS1=I_ML1, the current of the transistor M6 is nearly equal to 0.

Thus substantially no current flows through the transistor M7. As a result, the voltage at the drain of the transistor M7, that is the voltage at the output node 310 becomes nearly equal to the power supply voltage VDD.

When the reference signal ramps down, the voltage at the gate of the differential transistor M5 becomes lower than the voltage at the gate of the pixel transistor M3. In this state, most of the current of the tail current source IS1 flows through the pixel transistor M3, and the current of the differential transistor M5 becomes substantially equal to zero. As for the transistor M7, a current nearly equal to the current of the load transistor ML1 flows therethrough. Because I_ML1=2×I_ML2, the voltage at the output node 310 becomes nearly equal to the ground voltage.

As described above, the output circuit 105 detects a change in the current of the differential transistor M5. Even a change occurs in the drain current of the differential transistor M5, no significant change occurs in the voltage at the drain of the transistor M6. In other words, the control unit of the output circuit 105 controls the change in the voltage at the drain of the differential transistor M5 so as to be smaller than the change in the voltage at the output node. Thus, it is possible to reduce the change in the voltage of the reference signal VRMP. As a result, the present embodiment allows it to improve the accuracy of the signal output from the photoelectric conversion apparatus.

Ninth Embodiment

A photoelectric conversion apparatus according to an embodiment 9 is described below. The ninth embodiment is different from the eighth embodiment in that the capacitor element C2 of the control unit of the output circuit 105 is replaced with a second switch element SW3. Differences from the sixth embodiment are described below but a description of similar parts to those in the eighth embodiment is omitted. Note that in the present embodiment, the second switch element SW3 functions in a similar manner to that of the second switch element SW3 according to the third embodiment, and the second switch element SW3 according to the seventh embodiment.

Figure 13:
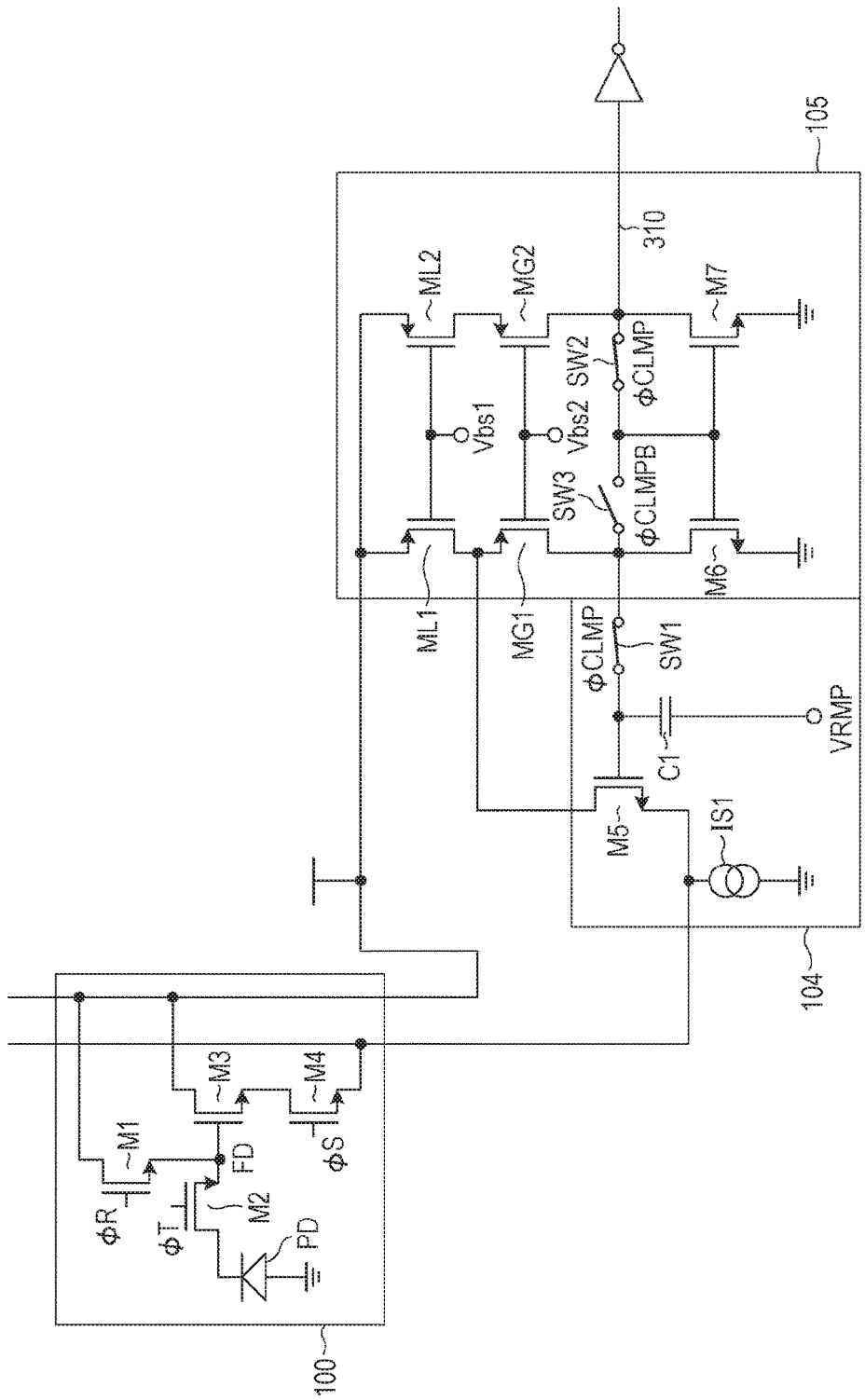
FIG. 13 is a diagram illustrating a circuit configuration of a photoelectric conversion apparatus.

FIG. 13 illustrates configurations of the pixel 100, the comparator circuit 104, and the output circuit 105 of the photoelectric conversion apparatus. For simplicity of illustration, only one pixel 100 is shown in FIG. 13. Parts similar in function to those in FIG. 3 or FIGS. 5 to 12 are denoted by similar reference numerals, and a further detailed description thereof is omitted.

As illustrated in FIG. 13, the control unit of the output circuit 105 includes a first switch element SW2 and a second switch element SW3. The first switch element SW2 connects the gate and the drain of the transistor M7. The second switch element SW3 electrically connects the drain and the gate of the transistor M6.

Thus, as with the eighth embodiment, the present embodiment allows it to improve the accuracy of the signal output from the photoelectric conversion apparatus.

Tenth Embodiment

Figure 14:
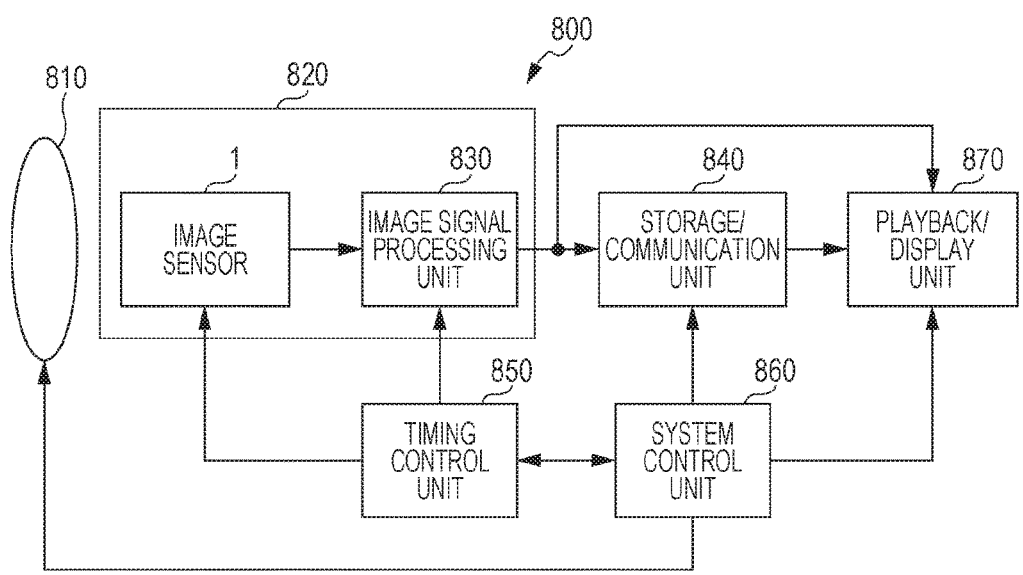
FIG. 14 is a diagram illustrating a configuration of a photoelectric conversion system.

FIG. 14 is a diagram illustrating a configuration of a photoelectric conversion system. The photoelectric conversion system 800 includes, for example, an optical unit 810, an image sensor 1, an image signal processing unit 830, a storage/communication unit 840, a timing control unit 850, a system control unit 860, and a playback/display unit 870. The image pickup apparatus 820 includes the image sensor 1 and the image signal processing unit 830. As for the image sensor 1, the photoelectric conversion apparatus described above in the embodiments is used.

The optical unit 810, which is an optical system such as a lens or the like, focuses light from an object onto a pixel array 102 including a two-dimensional array of a plurality of pixels in the image sensor 1 so as to form an image of the object. The image sensor 1 outputs a signal corresponding to light focused on the pixel array 102 in response to a signal from the timing control unit 850. The signal output from the image sensor 1 is input to the image signal processing unit 830 serving as an image signal processing unit, which performs signal processing according to a predetermined method using a program or the like. A signal obtained via the process performed with the image signal processing unit 830 is transmitted as image data to the storage/communication unit 840. The storage/communication unit 840 transmits a signal for forming an image to the playback/display unit 870 thereby making the playback/display unit 870 play and display a moving image or a still image. The storage/communication unit 840 also receives a signal from the image signal processing unit 830 and communicates with the system control unit 860. In addition, the storage/communication unit 840 also performs an operation of storing the signal for forming the image on a not-illustrated storage medium.

The system control unit 860 generally controls the operation of the image pickup system and controls driving of the optical unit 810, the timing control unit 850, the storage/communication unit 840, and the playback/display unit 870. The system control unit 860 includes, for example, a non-illustrated storage apparatus serving as a storage medium in which a program or the like necessary in controlling the operation of the image pickup system is stored. The system control unit 860 also supplies, to the inside of the image pickup system, a signal for switching the driving mode, for example, in response to an operation performed with a user. Specific examples include changing a row to be read out or a row to be reset, changing a field angle in electronic zooming, shifting a field angle in electronic image stabilization, and the like. The timing control unit 850 controls the timing of driving the image sensor 1 and the image signal processing unit 830 under the control of the system control unit 860.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
a photoelectric conversion element;
a differential pair including a first transistor configured to receive a signal based on an electric charge generated in the photoelectric conversion element and a second transistor configured to receive a reference signal; and
a current mirror circuit including a third transistor electrically connected to the second transistor and a fourth transistor having a gate connected to a gate of the third transistor and electrically connected to an output node,
wherein the output node is a different node from a drain of the first transistor.

2. The photoelectric conversion apparatus according to claim 1, further comprising:
a first switch element connecting the gate and a drain of the fourth transistor.

3. The photoelectric conversion apparatus according to claim 2, further comprising:
a clamp capacitance connected to a gate of the second transistor.

4. A photoelectric conversion system comprising:
the photoelectric conversion apparatus according to claim 1; and
a signal processing apparatus that processes a signal from the photoelectric conversion apparatus.

5. A photoelectric conversion apparatus comprising:
a photoelectric conversion element;
a differential pair including a first transistor configured to receive a signal based on an electric charge generated in the photoelectric conversion element and a second transistor configured to receive a reference signal; and
an output circuit including a current mirror circuit connected between a drain of the second transistor and an output node,
wherein
the output circuit is configured to receive a current from the second transistor, and to output a signal based on a result of a comparison between a voltage at the gate of the first transistor and a voltage at the gate of the second transistor to the output node, and
the output node is a different node from a drain of the first transistor.

6. The photoelectric conversion apparatus according to claim 5, wherein
the output circuit includes a first switch element, and
the output circuit is configured to output a voltage based on a voltage at a gate of the first transistor to the gate of the second transistor, and
the first switch element selects operations of the output circuit.

7. The photoelectric conversion apparatus according to claim 6, further comprising:
a clamp capacitance connected to a gate of the second transistor.

8. A photoelectric conversion system comprising:
the photoelectric conversion apparatus according to claim 5; and
a signal processing apparatus that processes a signal from the photoelectric conversion apparatus.

9. A photoelectric conversion apparatus comprising:
a photoelectric conversion element;
a differential pair including a first transistor configured to receive a signal based on an electric charge generated in the photoelectric conversion element and a second transistor configured to receive a reference signal; and
an output circuit connected between a drain of the second transistor and an output node and configured to perform
a first operation to output a voltage based on a voltage at a gate of the first transistor to the gate of the second transistor, and
a second operation to receive a current from the second transistor, and to output a signal based on a result of a comparison between the voltage at the gate of the first transistor and a voltage at the gate of the second transistor to the output node,
wherein the output circuit includes a control unit including a current mirror circuit and a first switch element, and
the first operation and the second operation is switched in response to the state of the switch elements.

10. The photoelectric conversion apparatus according to claim 9, wherein
the current mirror circuit includes a third transistor electrically connected to the drain of the second transistor and a fourth transistor having a gate connected to a gate of the third transistor.

11. The photoelectric conversion apparatus according to claim 10, wherein
the control unit includes a first switch element that connects the gate and a drain of the fourth transistor,
in the first operation, the current mirror circuit mirrors the current of the fourth transistor to the third transistor in response to turning-on of the first switch element, and
in the second operation, the current mirror circuit mirrors the current of the third transistor to the fourth transistor in response to turning-off of the first switch element.

12. The photoelectric conversion apparatus according to claim 11, wherein the control unit includes a capacitor element having a first terminal electrically connected to a drain of the third transistor and a second terminal electrically connected to the gate of the third transistor.

13. The photoelectric conversion apparatus according to claim 12, wherein the first terminal of the capacitor element is electrically connected to the drain of the third transistor via a common gate circuit.

14. The photoelectric conversion apparatus according to claim 12, wherein a capacitance of the capacitor element is greater than a capacitance of a coupling capacitor between two terminals of the first switch element in an off-state.

15. The photoelectric conversion apparatus according to claim 11, wherein the control unit includes a second switch element that electrically connects a drain and the gate of the third transistor.

16. The photoelectric conversion apparatus according to claim 15, wherein the second switch element is electrically connected to the drain of the third transistor via a common gate circuit.

17. The photoelectric conversion apparatus according to claim 16, wherein the first switch element and the second switch element operate in a complementary manner.

18. The photoelectric conversion apparatus according to claim 11, further comprising:
a clamp circuit configured to clamp a voltage at a gate of the second transistor, wherein
the clamp circuit includes a clamp switch element connected to the gate of the second transistor, and
the clamp switch element and the first switch element operate in a synchronous phase.

19. The photoelectric conversion apparatus according to claim 10, wherein
in the first operation, the current mirror circuit operates as a current source that supplies a current provided by the third transistor to the second transistor, and
in the second operation, the current mirror circuit operates as a current detection circuit that mirrors, into the fourth transistor, a current input to the third transistor from the second transistor.

20. The photoelectric conversion apparatus according to claim 10, wherein
the control unit includes a load transistor electrically connected to the drain of the second transistor,
the second transistor and the third transistor are connected so as to receive a current from the load transistor complementarily,
in the first operation, the load transistor operates as a current source that supplies a current to the second transistor, and
in the second operation, the current mirror circuit operates as a current detection circuit that mirrors, into the fourth transistor, a current input to the third transistor from the load transistor.

21. The photoelectric conversion apparatus according to claim 20, wherein the control unit includes a common gate circuit disposed in an electric path between the load transistor and the third transistor.

22. The photoelectric conversion apparatus according to claim 9, further comprising:
a clamp switch element connected to the gate of the second transistor; and
a clamp capacitor element having a first terminal connected to the gate of the second transistor and a second terminal configured to receive the reference signal.

23. The photoelectric conversion apparatus according to claim 22, wherein the clamp switch element connects the gate and the drain of the second transistor.

24. The photoelectric conversion apparatus according to claim 22, wherein the clamp switch element electrically connects the gate and the drain of the second transistor via a common gate circuit.

25. The photoelectric conversion apparatus according to claim 9, wherein the control unit controls an amount of change in a voltage at the drain of the second transistor that occurs in response to an inversion of a relationship between the voltage at the gate of the first transistor and the voltage at the gate of the second transistor so as to be smaller than an amount of change in the voltage at the output node that occurs in response to the inversion.

26. The photoelectric conversion apparatus according to claim 9, comprising a reference current source connected to the output node and configured to output a reference current.

27. The photoelectric conversion apparatus according to claim 9, comprising an inverter circuit connected to the output node.

28. The photoelectric conversion apparatus according to claim 9, wherein the differential pair includes a tail current source electrically connected to the first transistor and the second transistor.

29. The photoelectric conversion apparatus according to claim 9, further comprising a plurality of pixels each including the photoelectric conversion element and the first transistor,
wherein the second transistor and the first transistor included in each of the plurality of pixels form the differential pair.

30. The photoelectric conversion apparatus according to claim 29, further comprising a plurality of pixel columns each including the plurality of pixels and one of the second transistors disposed for common use by the plurality of pixels.

31. The photoelectric conversion apparatus according to claim 9, wherein the output node is a node different from any of a source and a drain of the first transistor and a source and the drain of the second transistor.

32. The photoelectric conversion apparatus according to claim 9, further comprising a current source electrically connected to the drain of the second transistor.

33. The photoelectric conversion apparatus according to claim 9, wherein the output circuit includes a common-source amplifier circuit configured to output a signal to the output node.

34. The photoelectric conversion apparatus according to claim 9, wherein
in the first operation, the voltage based on the voltage at the gate of the first transistor is output to the gate of the second transistor by turning on the clamp switch element.

35. The photoelectric conversion apparatus according to claim 9, wherein
in the first operation, the voltage which is output to the gate of the second transistor and the voltage at the gate of the first transistor have a difference due to a difference in characteristic between the first and second transistors.

36. The photoelectric conversion apparatus according to claim 9, further comprising:
a clamp circuit configured to clamp a voltage at a gate of the second transistor.

37. A photoelectric conversion system comprising:
the photoelectric conversion apparatus according to claim 9; and
a signal processing apparatus that processes a signal from the photoelectric conversion apparatus.

38. A photoelectric conversion apparatus comprising:
a photoelectric conversion element;
a differential pair including a first transistor configured to receive a signal based on an electric charge generated in the photoelectric conversion element and a second transistor configured to receive a reference signal;
a clamp circuit configured to clamp a voltage at a gate of the second transistor;
an output circuit connected between a drain of the second transistor and an output node and configured to perform
a first operation to output a voltage based on a voltage at a gate of the first transistor to the gate of the second transistor, and
a second operation to receive a current from the second transistor, and to output a signal based on a result of a comparison between the voltage at the gate of the first transistor and a voltage at the gate of the second transistor to the output node;
a first current mirror circuit electrically connected to a drain of the first transistor and configured to output a current to a first mirror output node by mirroring a current from the first transistor; and a second current mirror circuit electrically connected to the drain of the second transistor and configured to output a current to a second mirror output node by mirroring a current from the second transistor, wherein the clamp circuit includes a clamp switch element connecting the gate of the second transistor and the output node of the output circuit.

39. The photoelectric conversion apparatus according to claim 38, further comprising a third current mirror circuit configured to mirror a current from one of the first mirror output node and the second mirror output node, and to output a mirrored current to another one of the first mirror output node and the second mirror output node.

40. A photoelectric conversion apparatus comprising:
a photoelectric conversion element;
a differential pair including a first transistor configured to receive a signal based on an electric charge generated in the photoelectric conversion element and a second transistor configured to receive a reference signal;
a current mirror circuit including a third transistor electrically connected to the second transistor and a fourth transistor having a gate connected to a gate of the third transistor and electrically connected to an output node; and
a first switch element connected between the gate and a drain of the fourth transistor and having a first node connected to the drain of the fourth transistor and a second node connected to the gate of the fourth transistor,
wherein the output node is a different node from a drain of the first transistor.

41. The photoelectric conversion apparatus according to claim 40, further comprising
a clamp circuit configured to clamp a voltage at a gate of the second transistor.

42. The photoelectric conversion apparatus according to claim 40, further comprising a capacitor element having a first terminal electrically connected to a drain of the third transistor and a second terminal electrically connected to the gate of the third transistor.

43. The photoelectric conversion apparatus according to claim 40, further comprising a second switch element electrically connecting a drain and the gate of the third transistor.

44. The photoelectric conversion apparatus according to claim 40, wherein the clamp circuit includes a clamp switch element electrically connecting the gate and the drain of the second transistor.

45. The photoelectric conversion apparatus according to claim 40, wherein the clamp circuit includes a clamp switch element and a common gate circuit both disposed in an electric path between the drain and the gate of the second transistor.

46. A photoelectric conversion system comprising:
the photoelectric conversion apparatus according to claim 40; and
a signal processing apparatus that processes a signal from the photoelectric conversion apparatus.

47. The photoelectric conversion apparatus according to claim 1, further comprising a capacitor element having a first terminal electrically connected to a drain of the third transistor and a second terminal electrically connected to the gate of the third transistor.

48. The photoelectric conversion apparatus according to claim 1, further comprising a second switch element electrically connecting a drain and the gate of the third transistor.

49. The photoelectric conversion apparatus according to claim 1, wherein the clamp circuit includes a clamp switch element electrically connecting the gate and the drain of the second transistor.

50. The photoelectric conversion apparatus according to claim 1, wherein the clamp circuit includes a clamp switch element and a common gate circuit both disposed in an electric path between the drain and the gate of the second transistor.

51. The photoelectric conversion apparatus according to claim 2, wherein
the current mirror circuit mirrors the current of the fourth transistor to the third transistor in response to turning-on of the first switch element, and
the current mirror circuit mirrors the current of the third transistor to the fourth transistor in response to turning-off of the first switch element.

52. The photoelectric conversion apparatus according to claim 51, further comprising:
a capacitor element having a first terminal electrically connected to a drain of the third transistor and a second terminal electrically connected to the gate of the third transistor.

53. The photoelectric conversion apparatus according to claim 52, wherein the first terminal of the capacitor element is electrically connected to the drain of the third transistor via a common gate circuit.

54. The photoelectric conversion apparatus according to claim 52, wherein a capacitance of the capacitor element is greater than a capacitance of a coupling capacitor between two terminals of the first switch element in an off-state.

55. The photoelectric conversion apparatus according to claim 51, further comprising a second switch element that electrically connects a drain and the gate of the third transistor.

56. The photoelectric conversion apparatus according to claim 55, wherein the second switch element is electrically connected to the drain of the third transistor via a common gate circuit.

57. The photoelectric conversion apparatus according to claim 56, wherein the first switch element and the second switch element operate in a complementary manner.

58. The photoelectric conversion apparatus according to claim 2, further comprising:
a clamp circuit configured to clamp a voltage at a gate of the second transistor,
wherein
the clamp circuit includes a clamp switch element connected to the gate of the second transistor, and
the clamp switch element and the first switch element operate in a synchronous phase.

59. The photoelectric conversion apparatus according to claim 1, further comprising:
a clamp switch element connected to the gate of the second transistor; and
a clamp capacitor element having a first terminal connected to the gate of the second transistor and a second terminal configured to receive the reference signal.

60. The photoelectric conversion apparatus according to claim 59, wherein the clamp switch element connects the gate and the drain of the second transistor.

61. The photoelectric conversion apparatus according to claim 59, wherein the clamp switch element electrically connects the gate and the drain of the second transistor via a common gate circuit.

62. The photoelectric conversion apparatus according to claim 1, comprising a reference current source connected to the output node and configured to output a reference current.

63. The photoelectric conversion apparatus according to claim 1, comprising an inverter circuit connected to the output node.

64. The photoelectric conversion apparatus according to claim 1, wherein the differential pair includes a tail current source electrically connected to the first transistor and the second transistor.

65. The photoelectric conversion apparatus according to claim 1, further comprising a plurality of pixels each including the photoelectric conversion element and the first transistor,
  wherein the second transistor and the first transistor included in each of the plurality of pixels form the differential pair.

66. The photoelectric conversion apparatus according to claim 65, further comprising a plurality of pixel columns each including the plurality of pixels and one of the second transistors disposed for common use by the plurality of pixels.

67. The photoelectric conversion apparatus according to claim 1, wherein the output node is a node different from any of a source and a drain of the first transistor and a source and the drain of the second transistor.

68. The photoelectric conversion apparatus according to claim 1, further comprising a current source electrically connected to the drain of the second transistor.

69. The photoelectric conversion apparatus according to claim 1, wherein the output circuit includes a common-source amplifier circuit configured to output a signal to the output node.

* * * * *